(12) United States Patent
Yoon et al.

(10) Patent No.: US 9,716,214 B2
(45) Date of Patent: Jul. 25, 2017

(54) LIGHT-EMITTING DIODE PACKAGE

(71) Applicant: SAMSUNG ELECTRONICS CO., LTD., Suwon-si (KR)

(72) Inventors: Ju-heon Yoon, Seoul (KR); Hak-hwan Kim, Suwon-si (KR); Dae-sup Kim, Hwaseong-si (KR); Jeong-hee Kim, Hwaseong-si (KR); Dong-myung Shin, Seoul (KR); Kwang-seok Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/147,315

(22) Filed: May 5, 2016

(65) Prior Publication Data
US 2016/0372646 A1 Dec. 22, 2016

(30) Foreign Application Priority Data
Jun. 16, 2015 (KR) .......................... 10-2015-008147

(51) Int. Cl.
| H01L 33/16 | (2010.01) |
| H01L 33/38 | (2010.01) |
| H01L 33/62 | (2010.01) |
| H05B 33/08 | (2006.01) |
| H01L 33/20 | (2010.01) |

(52) U.S. Cl.
CPC ........... *H01L 33/62* (2013.01); *H05B 33/086* (2013.01); *H01L 33/16* (2013.01); *H01L 33/20* (2013.01); *H01L 33/38* (2013.01)

(58) Field of Classification Search
CPC ................................ H01L 33/16; H01L 33/38
USPC .......................................................... 257/79
See application file for complete search history.

(56) References Cited

U.S. PATENT DOCUMENTS

| 6,372,608 | B1 | 4/2002 | Shimoda et al. |
| 6,437,363 | B1 * | 8/2002 | Kadota ................. H01L 33/007 257/103 |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 * | 12/2006 | Han ........................ H01L 33/38 257/88 |

(Continued)

FOREIGN PATENT DOCUMENTS

| JP | 2013-51298 A | 3/2013 |
| KR | 10-0335796 B1 | 5/2002 |

(Continued)

*Primary Examiner* — George Fourson, III
(74) *Attorney, Agent, or Firm* — Sughrue Mion, PLLC

(57) ABSTRACT

An LED package includes a substrate, a light-emitting structure provided on the substrate, an electrode structure provided on the light-emitting structure, and an external connection terminal provided on the electrode structure, the external connection terminal comprising a major axis and a minor axis. The major axis of the external connection terminal is perpendicular to a cleaving plane of the substrate.

20 Claims, 25 Drawing Sheets

(56) References Cited

U.S. PATENT DOCUMENTS

| | | | |
|---|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,871,540 B2 | 10/2014 | Sato |
| 8,970,053 B2 | 3/2015 | Wang et al. |
| 2001/0055324 A1* | 12/2001 | Ota | H01S 5/32341 372/43.01 |
| 2002/0046695 A1* | 4/2002 | Sarayama | C30B 11/002 117/84 |
| 2002/0063258 A1* | 5/2002 | Motoki | H01L 33/16 257/95 |
| 2003/0013240 A1* | 1/2003 | Asano | H01L 21/3043 438/168 |
| 2003/0057444 A1* | 3/2003 | Niki | H01L 33/007 257/200 |
| 2004/0169185 A1* | 9/2004 | Liu | H01L 33/32 257/96 |
| 2005/0061230 A1* | 3/2005 | Kokta | C30B 11/00 117/11 |
| 2005/0212002 A1* | 9/2005 | Sanga | H01L 33/20 257/96 |
| 2007/0001190 A1* | 1/2007 | Kim | H01L 33/0079 257/99 |
| 2009/0267065 A1* | 10/2009 | Horio | H01L 33/16 257/43 |
| 2010/0193833 A1* | 8/2010 | Miyake | B82Y 20/00 257/103 |
| 2010/0237382 A1* | 9/2010 | Kamei | H01L 33/16 257/99 |
| 2010/0329296 A1* | 12/2010 | Hata | H01S 5/405 372/50.12 |
| 2011/0169043 A1* | 7/2011 | Kang | H01L 33/16 257/99 |
| 2011/0275172 A1* | 11/2011 | Okabe | H01L 33/0095 438/33 |
| 2014/0209938 A1* | 7/2014 | Emura | H01L 27/156 257/88 |
| 2014/0349095 A1* | 11/2014 | Beckmann | C23C 14/34 428/215 |
| 2015/0325760 A1* | 11/2015 | Suenaga | H01L 33/005 257/99 |

FOREIGN PATENT DOCUMENTS

| | | |
|---|---|---|
| KR | 10-2005-0104151 A | 11/2005 |
| KR | 10-0576317 B1 | 5/2006 |

* cited by examiner

LIGHT-EMITTING DIODE PACKAGE

CROSS-REFERENCE TO RELATED APPLICATION

This application claims priority from Korean Patent Application No. 10-2015-0085147, filed on Jun. 16, 2015, in the Korean Intellectual Property Office, the disclosure of which is incorporated herein by reference in its entirety.

BACKGROUND

Apparatuses consistent with exemplary embodiments relate to a light-emitting diode (LED) package and a manufacturing method thereof, and more particularly, to a flip chip LED package in which fewer diodes are damaged and a manufacturing method of the flip chip LED package.

An LED package is a semiconductor device that is capable of generating variously colored light rays by utilizing a recombination of electrons and holes, when current is applied, at an area where first and second conductive semiconductors are attached. The demand for such LED packages is increasing due to the advantages thereof. Compared to a filament-based light bulb, an LED package has, for example, a longer lifespan, lower power consumption, and excellent initial operation properties. From among various types of LED packages, a flip chip LED package has a structure in which an electrode is directly bonded to a module via a bump. The flip chip LED package is used in apparatuses that consume high power because heat generated during operation is directly emitted to the module via the bump with excellent heat conductivity. However, stress may be concentrated on a substrate of the flip chip LED package due to a difference between respective thermal expansion coefficients of the bump and the module. When there is a notch in the stress concentrated area, a diode may be damaged due to the stress.

SUMMARY

One or more exemplary embodiments provide an LED package in which fewer diodes are damaged.

Additional aspects will be set forth in part in the description which follows and, in part, will be apparent from the description, or may be learned by practice of the exemplary embodiments.

According to an aspect of tan exemplary embodiment, there is provided a light-emitting diode (LED) package including a substrate, a light-emitting structure on the substrate, an electrode structure on the light-emitting structure, and an external connection terminal on the electrode structure, having a major axis and a minor axis. The major axis of the external connection terminal is perpendicular to a (10-10) plane from among crystal planes of the substrate.

In an exemplary embodiment, the substrate transmits light, and light generated by the light-emitting structure is emitted in a direction toward the substrate.

In an exemplary embodiment, the substrate is a sapphire substrate.

In an exemplary embodiment, a portion of the substrate includes a straight flat zone, and the flat zone is a (11-20) plane from among the crystal planes of the substrate.

In an exemplary embodiment, the light-emitting structure includes a first conductive semiconductor layer, an active layer, and a second conductive semiconductor layer.

In an exemplary embodiment, the light-emitting structure includes a gallium nitride based material.

In an exemplary embodiment, the electrode structure includes a first electrode structure and a second electrode structure, and the external connection terminal includes a first external connection terminal that is electrically connected to the first electrode structure, and a second external connection terminal that is electrically connected to the second electrode structure.

In an exemplary embodiment, each of the first and second external connection terminals includes at least one conductive sub-terminal.

In an exemplary embodiment, the substrate has a stress concentration area where a stress of 1 GPa or more is concentrated, and the stress concentration area is on a surface of the substrate that is parallel to the major axis of the external connection terminal.

In an exemplary embodiment, when there is a crack on the substrate, a spreading direction of the crack is perpendicular to an extending direction of the major axis of the external connection terminal.

According to an aspect of another exemplary embodiment, there is provided an LED package including a sapphire substrate, a light-emitting structure on the sapphire substrate, including a first conductive semiconductor layer, an active layer, and a second conductive semiconductor layer, a first electrode structure that is electrically connected to the first conductive semiconductor layer, and a second electrode structure that is electrically connected to the second conductive semiconductor layer, and a first external connection terminal that is electrically connected to the first electrode structure and has a major axis and a minor axis, and a second external connection terminal that is electrically connected to the second electrode structure and has a major axis and a minor axis. Light generated from the light-emitting structure is emitted in a direction toward the sapphire substrate, and the first and second external connection terminals are spaced apart from each other, and the respective major axes of the first and second external connection terminals are parallel to a direction of an m(10-10) plane from among crystal directions of the sapphire substrate.

In an exemplary embodiment, a crystal plane of an upper surface of the sapphire substrate is a (0001) plane or a (000-1) plane.

In an exemplary embodiment, the respective major axes of the first and second external connection terminals are perpendicular to the (10-10) plane from among crystal planes of the sapphire substrate.

In an exemplary embodiment, each of the first and second external connection terminals includes a plurality of sub-terminals.

In an exemplary embodiment, the first and second electrode structures reflect light generated from the light-emitting structure.

According to an aspect of another exemplary embodiment, there is provided a light-emitting diode (LED) package comprising: a substrate; a light-emitting structure provided on the substrate; an electrode structure provided on the light-emitting structure; and an external connection terminal provided on the electrode structure, the external connection terminal comprising a major axis and a minor axis, wherein the major axis of the external connection terminal is perpendicular to an m(10-10) plane of the substrate.

The major axis may correspond to an extending direction of a first side of the external connection terminal which is longer than a second side of the external connection terminal, the second side extending in a direction substantially perpendicular to the first side, and the minor axis extends in a direction substantially perpendicular to the major axis.

The substrate may transmit light, and the light generated by the light-emitting structure may be emitted in a direction toward the substrate.

The substrate may be a sapphire substrate.

A portion of the substrate may include a straight flat zone, and the flat zone may correspond to a (11-20) plane from among the crystal planes of the substrate.

The light-emitting structure may include: a first conductive semiconductor layer; an active layer; and a second conductive semiconductor layer.

The light-emitting structure may include a gallium nitride based material.

The electrode structure may include: a first electrode structure; and a second electrode structure, and wherein the external connection terminal may include: a first external connection terminal that is electrically connected to the first electrode structure; and a second external connection terminal that is electrically connected to the second electrode structure.

The first external connection terminal may include at least one first conductive sub-terminal, and the second external connection terminal may include at least one second conductive sub-terminal.

The substrate may include a stress concentration area having a stress of 1 GPa or more being concentrated, and the stress concentration area may be provided on a surface of the substrate that is parallel to the major axis of the external connection terminal.

In response to a crack being on the substrate, a spreading direction of the crack may be perpendicular to an extending direction of the major axis of the external connection terminal.

According to an aspect of another exemplary embodiment, there is provided an LED package including: a sapphire substrate; a light-emitting structure provided on the sapphire substrate, the light-emitting structure including: a first conductive semiconductor layer; an active layer; and a second conductive semiconductor layer; a first electrode structure electrically connected to the first conductive semiconductor layer; a second electrode structure electrically connected to the second conductive semiconductor layer; a first external connection terminal electrically connected to the first electrode structure and comprising a first major axis and a first minor axis; and a second external connection terminal electrically connected to the second electrode structure and comprising a second major axis and a second minor axis, light generated from the light-emitting structure may be emitted in a direction toward the sapphire substrate, the first and second external connection terminals may be spaced apart from each other, and an extending direction of the major axes of the first and the second external connection terminals may be perpendicular to an extending direction of an m(10-10) plane of the sapphire substrate.

The first major axis may correspond to an extending direction of a first side of the first external connection terminal which is longer than a second side of the first external connection terminal, the second side of the first external connection terminal extending in a direction substantially perpendicular to the first side of the first external connection terminal, the first minor axis may extend in a direction substantially perpendicular to the first major axis, the second major axis may correspond to an extending direction of a first side of the second external connection terminal which is longer than a second side of the second external connection terminal, the second side of the second external connection terminal extending in a direction substantially perpendicular to the first side of the second external connection terminal, and the second minor axis may extend in a direction substantially perpendicular to the second major axis.

A crystal plane of an upper surface of the sapphire substrate may correspond to a (0001) plane or a (000-1) plane, the light-emitting structure provided on the upper surface of the sapphire substrate.

The first and the second electrode structures may reflect light generated from the light-emitting structure.

According to an aspect of another exemplary embodiment, there is provided a light-emitting diode (LED) package including: a substrate; a light-emitting structure provided on the substrate; an electrode structure provided on the light-emitting structure; and an external connection terminal provided on the electrode structure, the external connection terminal comprising a major axis and a minor axis, the major axis of the external connection terminal may be perpendicular to a cleaving plane of the substrate.

The cleaving plane of the substrate may correspond to an m(10-10) plane among crystal planes of the substrate.

The major axis corresponds to an extending direction of a first side of the external connection terminal which is longer than a second side of the external connection terminal, the second side extending in a direction substantially perpendicular to the first side, and the minor axis may extend in a direction substantially perpendicular to the major axis.

BRIEF DESCRIPTION OF THE DRAWINGS

The above and/or other aspects of the disclosure will be more clearly understood from the following detailed description taken in conjunction with the accompanying drawings in which.

DETAILED DESCRIPTION

Figure 1:
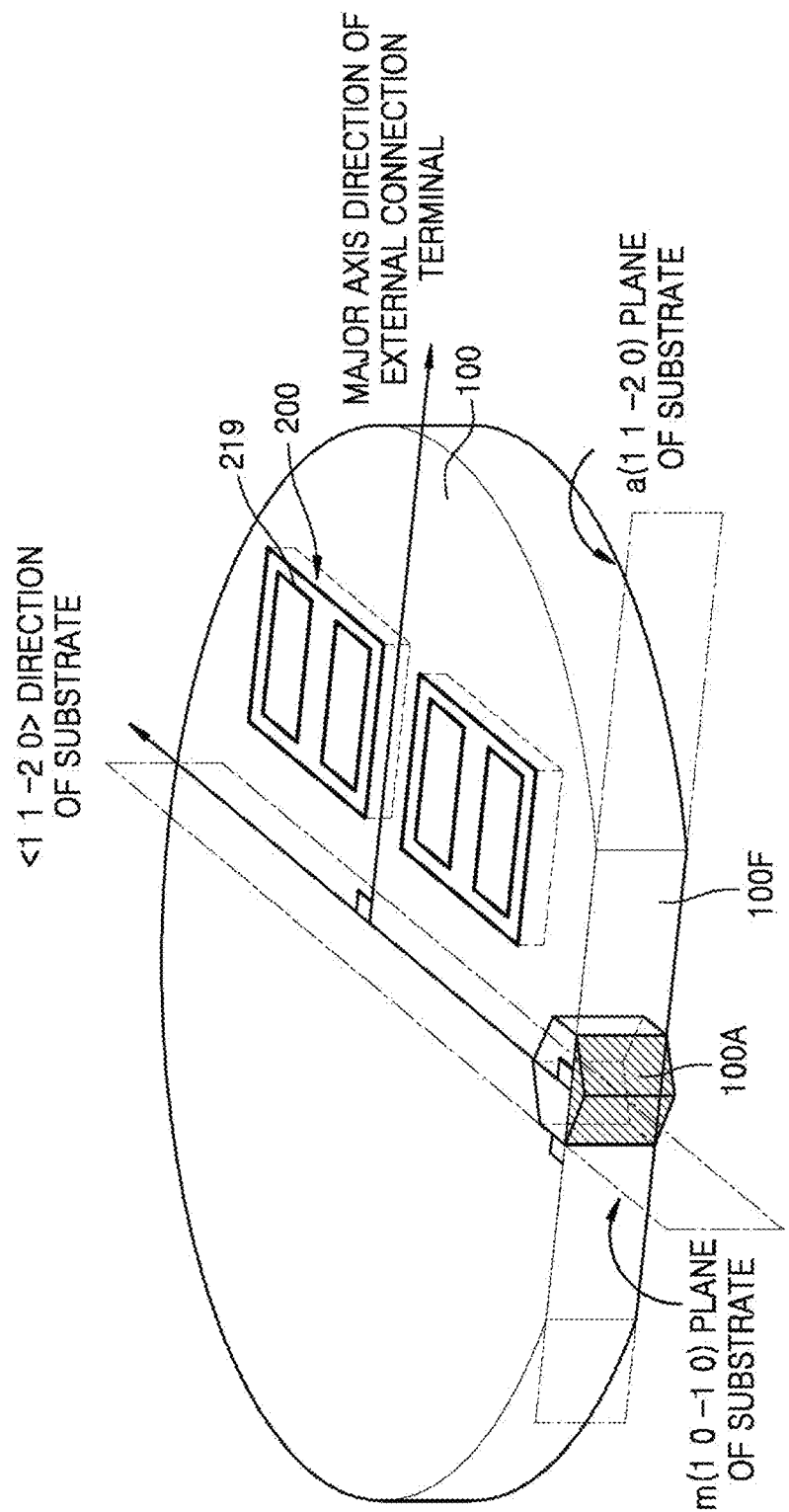
FIG. 1 is a perspective view of a substrate for manufacturing a light-emitting diode (LED) package, according to an exemplary embodiment.

Hereinafter, Exemplary embodiments of the inventive concept will be described more fully with reference to the accompanying drawings. This inventive concept may, however, be embodied in many different forms and should not be construed as being limited to the exemplary embodiments set forth herein. Rather, the exemplary embodiments are provided so that this disclosure will be thorough and complete, and will fully convey the scope of the inventive concept to one of ordinary skill in the art. Sizes of components in the drawings may be exaggerated for convenience of explanation. As used herein, the term "and/or" includes any and all combinations of one or more of the associated listed items. Expressions such as "at least one of" when preceding a list of elements, modify the entire list of elements and do not modify the individual elements of the list.

It will be understood that when an element is referred to as being "formed on" or "contacts" another element, the element may be directly touching or connected to the other element, or intervening elements may be present. However, when an element is referred to as being "directly formed on" or "directly contacts" another element, intervening elements may not be present. Other expressions that describe relationships between elements, such as "between" and "directly between," may also be understood similarly to the above description.

While such terms as "first," "second," etc., may be used to describe various components, such components must not be limited to the above terms. The above terms are used only to distinguish one component from another. For example, within the scope of the present inventive concept, a first component may be referred to as a second component, and vice versa.

An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, terms that are used to describe the exemplary embodiments have the same meaning as commonly understood by one of ordinary skill in the art. Hereinafter, exemplary embodiments will be described with reference to the accompanying drawings.

FIG. 1 is a perspective view of a substrate 100 for manufacturing a light-emitting diode (LED) package 200, according to an exemplary embodiment.

Referring to FIG. 1, the LED package 200 is arranged in a certain direction on the substrate 100. In the related art, the LED package 200 is manufactured by forming a plurality of LEDs on the substrate 100, dicing the LEDs into separate LEDs, and then packaging the separate LEDs. For convenience, an example in which the LED package 200 is on the substrate 100 is described.

The LED package 200 may include a portion of the substrate 100. The substrate 100 may have light-transmitting characteristics. The substrate 100 may include a light-transmitting material, or have light-transmitting characteristics when a thickness of the substrate 100 is smaller than a threshold thickness.

The substrate 100 may be an insulative, conductive, or semiconductor substrate according to requirements. For example, the substrate 100 may include sapphire ($Al_2O_3$), gallium nitride (GaN), silicon (Si), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$).

In exemplary embodiments, a sapphire substrate or SiC substrate is usually used. The sapphire substrate is more utilized than the SiC substrate which is relatively more expensive. When a heterogeneous substrate is used, due to a difference between respective lattice constants of a substrate material and a thin film material, occurrences of defects such as dislocation (e.g., crack or split) may increase. Also, due to a difference between respective thermal expansion coefficients of the substrate material and the thin film material, the substrate or the thin film may bend when temperature changes and thus cause the substrate or the thin film to crack.

In exemplary embodiments, the substrate may be a silicon substrate which is more appropriate for large diameters and cheaper. Mass production is more convenient by using the silicon substrate.

Hereinafter, the sapphire substrate will be described as an example. Sapphire is a crystal body having Hexa-Rhombo symmetry. The crystal has a lattice constant of 13.001 Å in a c-axis direction, and a lattice constant of 4.758 Å in an a-axis direction, and has a c(0001) plane, a(11-20) plane, and an m(10-10) plane. Because the c plane of the sapphire substrate allows a nitride thin film to be relatively easily grown thereupon and is stable even at high temperatures, it is frequently utilized as a substrate for nitride growth. The substrate 100 according to the exemplary embodiment may have a crystal structure 100A having Hexa-Rhombo symmetry.

Because the sapphire is a light-transmitting material, light may be effectively emitted from an LED in a direction toward the substrate 100. Thus, the LED package 200 may be mounted on a module such as a lead frame using a flip chip method.

Although the sapphire has excellent in terms of hardness, the sapphire has a cleaving plane that may easily crack in a direction of a crystal plane. When the sapphire is included in a substrate of an LED, in order to reduce a defect caused by a difference between respective lattice constants of the sapphire substrate and a GaN-based semiconductor layer on the sapphire substrate, the sapphire substrate is grown such that a (0001) plane or a (000-1) plane is an upper surface of the substrate. In the exemplary embodiment, a lattice array of the m(10-10) plane of the sapphire substrate becomes a cleaving plane that may easily break.

The substrate 100 may include a flat zone 100F that is a straight portion of the substrate 100 to arrange the substrate 100. The substrate 100 may have one or more flat zones 100F. The flat zone 100F may be formed along a certain crystal plane of the substrate 100, for example, the a(11-20) plane. In this case, the cleaving plane of the substrate 100, i.e., the m(10-10) plane, is perpendicular to the flat zone 100F. That is, the flat zone 100F may easily crack in a perpendicular direction than other directions.

A plurality of LEDs may be provided on the substrate 100. The LEDs are arranged in a particular direction according to characteristics of the manufacturing process. The LEDs are provided on the substrate 100, and then separated into individual LEDs along dicing lines. Each of the LEDs is formed as the LED package 200 via a packaging process. The LED may include an electrode structure and an external connection terminal 219 that is electrically connected to the electrode structure. The external connection terminal 219 may be formed as a solder bump. The external connection terminal 219 may be directly connected to a module such as a lead frame. In the exemplary embodiment, because a thermal expansion coefficient of a material in the external connection terminal 219 is different from that of a material in the module, the external connection terminal 219 may receive compression stress or tension stress according to temperatures. The compression stress or the tension stress may be transferred to the substrate 100 above the external connection terminal 219.

When there is a notch in the substrate 100, the stress may be concentrated on the notch. When a stress concentrated area is in the same direction as the cleaving plane of the substrate 100, the substrate 100 may crack and the cracks may spread, which thus may damage the LEDs. The notch usually occurs in between the external connection terminals 219. That is, the external connection terminal 219 includes a first external connection terminal that is electrically connected with a first electrode structure and a second external connection terminal that is electrically connected with a second electrode structure. The notch may be formed between an area of the substrate 100 between the first and second external connection terminals. Therefore, in the LED package 200 according to the exemplary embodiment, the LEDs are provided on the substrate 100 such that a major axis direction of the external connection terminal 219 is perpendicular to the m(10-10) plane of the substrate 100. In this case, because the notch between the external connection terminals 219 is perpendicular to the cleaving plane of the substrate 100, i.e., the m(10-10) plane, cracks may not easily spread and thus the LEDs is prevented from being damaged.

Figure 2:
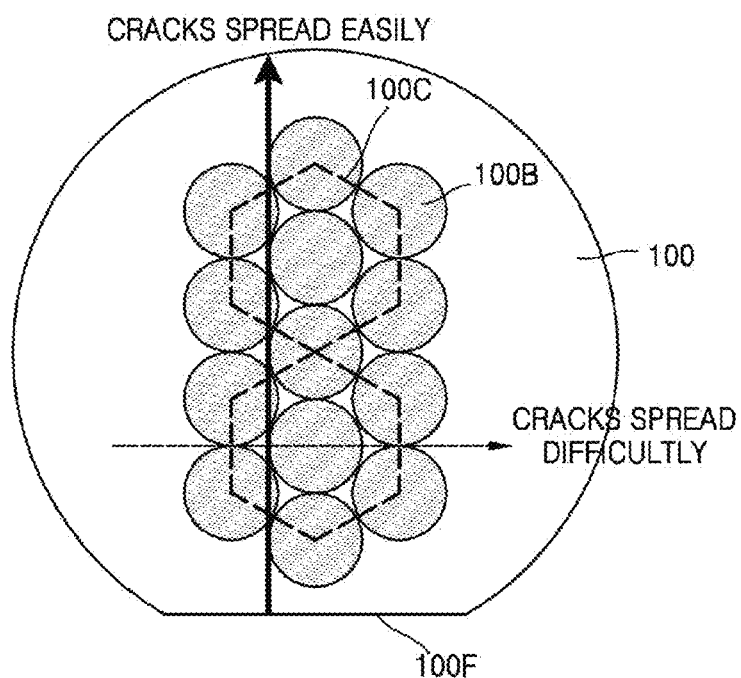
FIG. 2 is a diagram of a lattice array of atoms on a substrate for manufacturing an LED package, according to an exemplary embodiment.

FIG. 2 is a diagram of a lattice array of atoms on the substrate 100 for manufacturing an LED package, according to an exemplary embodiment.

Referring to FIG. 2, the substrate 100 made with sapphire includes atoms 100B and a lattice array 100C of atoms. The lattice array 100C of a crystal body having Hexa-Rhombo symmetry, e.g., sapphire, has one atom 100B in the center and six (6) other atoms 100B surrounding the atom 100B in the center. A crystal plane formed by the lattice array 100C may be the c(0001) plane. A GaN layer is deposited on the substrate 100 to form the smallest lattice defect. Cracks on the substrate 100 may spread easily between the atoms 100B. With regard to the lattice array 100C, it is difficult for the cracks to spread in a direction parallel to the flat zone 100F, but easy to spread in a direction perpendicular to the flat zone 100F. For convenience, FIG. 2 illustrates that the atoms 100B are adjacent to each other. However, the atoms 100B may be spaced apart by a certain distance in actual practice. When spaces between the atoms 100B are arranged with a particular rule, compared to other directions, cracks may easily spread in a direction in which the spaces are arranged.

Figure 3A:
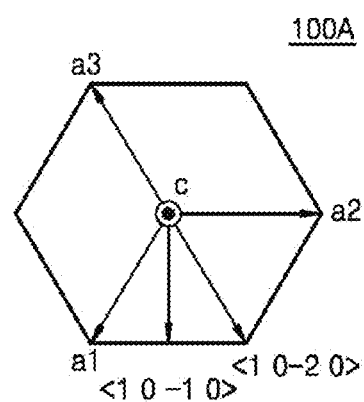
FIGS. 3A and 3B are diagrams of a crystal structure of a substrate for manufacturing an LED package, according to an exemplary embodiment.
Figure 3B:
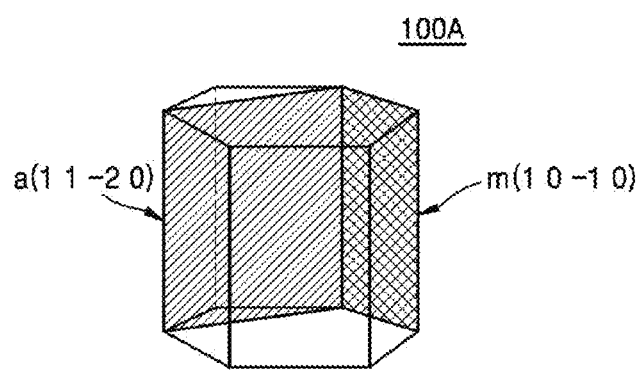

FIGS. 3A and 3B are diagrams of a crystal structure 100A of a substrate for manufacturing an LED package, according to an exemplary embodiment.

FIG. 3A shows axial directions in the crystal structure 100A having the Hexa-Rhombo symmetry. The hexagonal crystal system may have four (4) plane indices and four (4) direction indices. As shown in FIG. 3A, a unit table of a hexagonal lattice includes an a1-axis direction, an a2-axis direction, and an a3-axis direction that cross each other and form 120° on a plane, and a c-axis direction that is perpendicular to the plane. Therefore, the plane indices and the direction indices of the hexagonal crystal system require four (4) indices that respectively correspond to the 4 axes. The a1-axis direction, the a2-axis direction, and the a3-axis direction may be respectively indicated as <2-1-10>, <-12-10>, and <-1-120> according to the Miller-Bravais indices. According to the exemplary embodiment, any one of the a1-axis direction, the a2-axis direction, and the a3-axis direction may be the same as the direction of a cleaving plane of a substrate (100 of FIG. 1).

FIG. 3B illustrates crystal planes in the crystal structure 100A having the Hexa-Rhombo symmetry.

The crystal structure 100A includes a plurality of crystal plane s. According to the exemplary embodiment, the a(11-20) plane and the m(10-10) plane will be described. The a(11-20) plane is perpendicular to the m(10-10) plane. As described above, the m(10-10) plane is a cleaving plane of a substrate which may easily crack, and the a(11-20) plane is a crystal plane of the substrate which does not easily crack. In a sapphire substrate including the crystal structure 100A having the Hexa-Rhombo symmetry, different crystal planes may form a flat zone depending on a substrate manufacturing method. Therefore, before manufacturing an LED package according to the exemplary embodiment, the crystal plane of the substrate has to be identified first.

Figure 4:
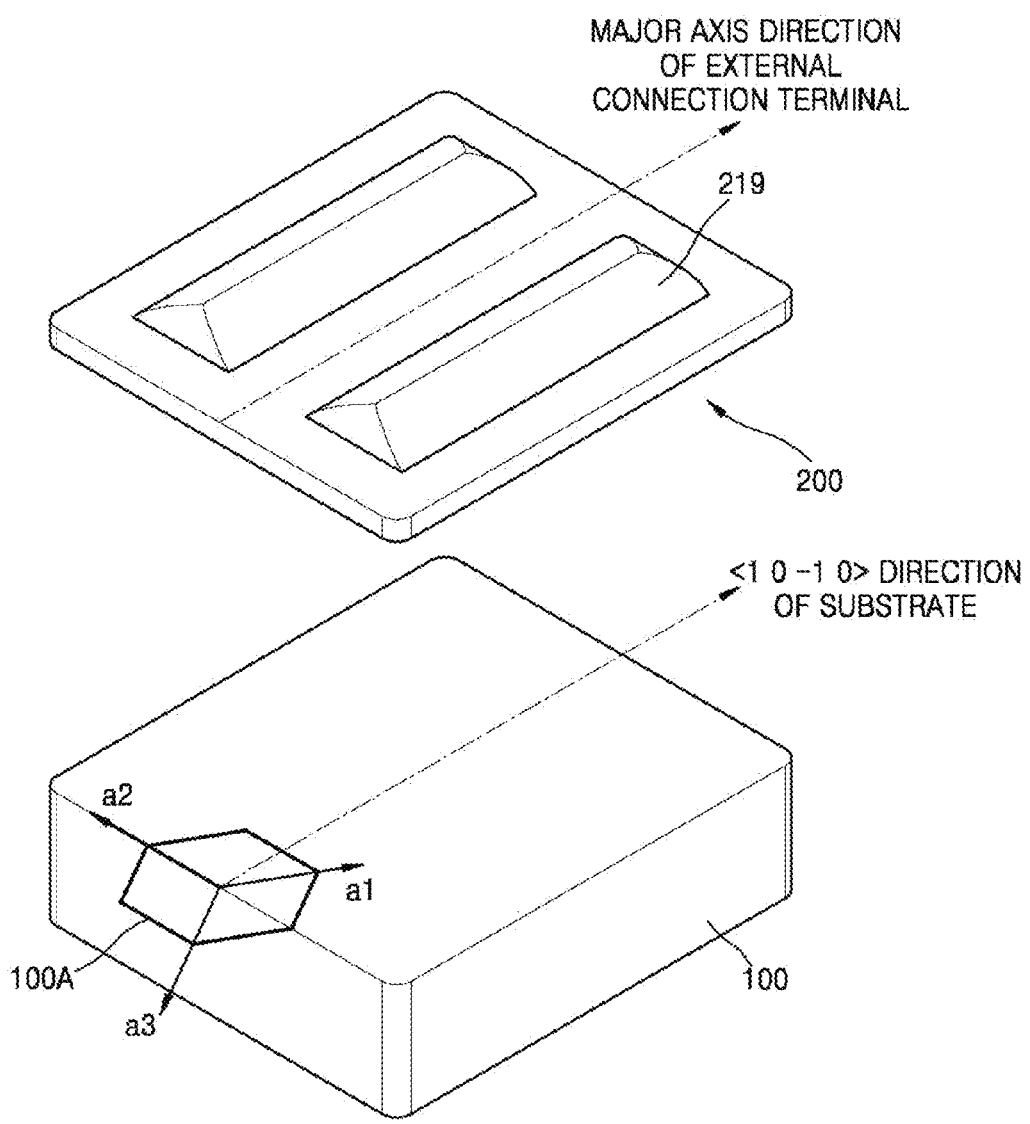
FIG. 4 is a perspective view for explaining a relationship between an LED package and a substrate, according to an exemplary embodiment.

FIG. 4 is a perspective view of a relationship between an LED package 200 and a substrate 100, according to an exemplary embodiment.

Referring to FIG. 4, a plurality of LEDs are provided on the substrate 100, each of the LEDs is diced into individual LEDs, and the diced LEDs are manufactured in the form of LED packages 200. Although the substrate is not separated in a flip chip LED package in general, for convenience, the substrate 100 and the LED package 200 will be separately described. The substrate 100 in the LED package 200 is a portion of the substrate 100 of FIG. 1. That is, because the LEDs are diced in the form of squares or rectangles, the substrate 100 of FIG. 4 does not include the flat zone 100F as in the substrate 100 of FIG. 1. However, the substrate 100 of FIG. 4 still includes a crystal plane and a crystal direction. Any one of the a1-axis direction, the a2-axis direction, and the a3-axis direction in the crystal structure 100A having the Hexa-Rhombo symmetry is perpendicular to a major axis direction of the external connection terminal 219 of the LED package 200. Also, the m(10-10) plane is perpendicular to the major axis direction of the external connection terminal 219. The LEDs may be provided on the c(0001) plane of the substrate 100.

Figure 5:
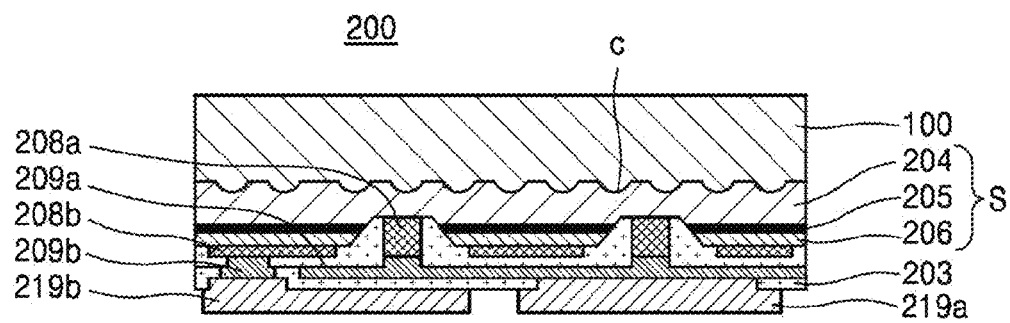
FIG. 5 is a cross-sectional view of an LED package, according to an exemplary embodiment.

FIG. 5 is a cross-sectional view of the LED package 200, according to an exemplary embodiment.

Referring to FIG. 5, the LED package 200 includes the substrate 100 on a side of a light-emission stack S, and first and second electrodes 208a and 208b on a side of the light-emission stack S opposite to the substrate 100. The substrate 100 may be the substrate 100 described with reference to FIGS. 1 to 4. Also, the LED package 200 includes an insulating unit 203 that covers the first and second electrodes 208a and 208b. The first and second electrodes 208a and 208b may be connected with first and second external connection terminals 219a and 219b via first and second electric connectors 209a and 209b. The first electrode structure includes the first electrode 208a and the first electric connector 209a, and the second electrode structure includes the second electrode 208b and the second electric connector 209b.

The light-emission stack S may include, sequentially, a first conductive semiconductor layer 204, an active layer 205, and a second conductive semiconductor layer 206 on the substrate 100. The first electrode 208a may be provided in a conductive via that penetrates through the second conductive semiconductor layer 206 and the active layer 205 and is connected with the first conductive semiconductor layer 204. The second electrode 208b may be connected with the second conductive semiconductor layer 206.

The first and second electrodes 208a and 208b are formed by depositing a conductive ohmic material on the light-emission stack S. Each of the first and second electrodes 208a and 208b may be an electrode that includes at least one of silver (Ag), aluminum (Al), nickel (Ni), chrome (Cr), copper (Cu), gold (Au), palladium (Pd), platinum (Pt), tin (Sn), titanium (Ti), tungsten (W), rhodium (Rh), iridium (Jr), ruthenium (Ru), magnesium (Mg), zinc (Zn), and an alloy thereof. For example, the second electrode 208b is formed by stacking an Ag ohmic electrode with respect to a second conductive semiconductor layer. The Ag ohmic electrode may function as a light reflection layer. A layer of any one of Ni, Ti, Pt, W, and an alloy thereof may be selectively and alternately stacked on the Ag layer. For example, under the Ag layer, a Ni/Ti layer, a TiW/Pt layer, or a Ti/W layer may be stacked or all three layers may be alternately stacked. The first electrode 208a may be formed by stacking a Cr layer with respect to the first conductive semiconductor layer 204. An Au Au/Pt/Ti layer may be sequentially stacked on the Cr layer.

The first and second electrodes 208a and 208b may employ various materials or stack structures other than the above exemplary embodiment to improve ohmic characteristics or reflective characteristics.

The insulating unit 203 includes an open area to expose at least a portion of the first and second electrodes 208a and 208b, and the first and second external connection terminals 219a and 219b may be respectively connected with the first and second electrodes 208a and 208b. The insulating unit 203 may be formed by depositing $SiO_2$ and/or SiN in a thickness of about 0.01 μm to about 3 μm.

The first and second external connection terminals 219a and 219b may be arranged in an identical direction and mounted on a module such as a lead frame using a flip chip method. In the exemplary embodiment, the first and second external connection terminals 219a and 219b may be arranged such that the first and second external connection terminals 219a and 219b face the same direction.

In the LED package 200 according to the exemplary embodiment, a direction of the crystal plane of the substrate 100 and directions of the first and second external connection terminals 219a and 219b are important. An extending direction of the m(10-10) plane of the substrate 100 may be perpendicular to respective major axis directions of the first and second external connection terminals 219a and 219b.

The first electric connector 209a may be a conductive via connected to the first conductive semiconductor layer 204 through the second conductive semiconductor layer 206 and the active layer 205. The first electrode 208a may be electrically connected to the first electric connector 209a.

The number, shape, pitch, and a contact area with the first conductive semiconductor layer 204 may be adjusted for the conductive via and the first electric connector 209a such that contact resistance decreases. The conductive via and the first electric connector 209a may be arranged in rows as columnar structure to improve current flow.

An electrode structure according to an exemplary embodiment may include the second electrode 208b directly on the second conductive semiconductor layer 206, and the second electric connector 209b on the second electrode 208b. The second electrode 208b may form an electric ohmic contact with the second conductive semiconductor layer 206, and include a light reflection material. Accordingly, when the LED package 200 is formed using the flip chip method, the second electrode 208b may effectively emit light from the active layer 205 in a direction toward the substrate 100. According to light emission directions, the second electrode 208b may include a light transmitting conductive material, for example, a transparent conductive oxide.

The two electrode structures may be electrically separated by the insulating unit 203. The insulating unit 203 may include any type of electrically insulative material that has a low light absorption rate, for example, $SiO_2$, $SiO_xN_y$, or $Si_xN_y$. If necessary, a light reflection filler may be dispersed in a light transmitting material to form a light reflection structure.

The first and second external connection terminals 219a and 219b may be respectively connected with the first and second electric connectors 209a and 209b and function as external connection terminals of the LED package 200. For example, each of the first and second external connection terminals 219a and 219b may include at least one of Au, Ag, Al, Ti, W, Cu, Sn, Ni, Pt, Cr, NiSn, TiW, AuSn, and a eutectic metal thereof. In the exemplary embodiment, when the LED package 200 is mounted on a module (300 of FIG. 7), the first and second external connection terminals 219a and 219b may be bonded by using the eutectic metal. Thus, a solder bump that is generally required for flip chip bonding may be unnecessary. When mounting, the heat dissipation effect is better when using the eutectic metal than when using the solder bump. In the exemplary embodiment, in order to obtain excellent heat dissipation effects, the first and second external connection terminals 219a and 219b may be formed to cover a large area.

The substrate 100 may have main surfaces (external surface or two opposite surfaces), and protrusions and depressions may be formed on at least one of the main surfaces. The protrusions and depressions on one surface of the main surfaces may be formed by etching a portion of the substrate 100 and thus be formed of the same material as the substrate 100. Alternatively, the protrusions and depressions may be formed by using a different material from the substrate 100.

Because the uneven structure C is formed on the interface between the substrate 100 and the first conductive semiconductor layer 204 204, the paths of light emitted from the active layer 205 may be widely varied, and thus, a light absorption ratio of light absorbed within the semiconductor layer can be reduced and a light scattering ratio can be increased, increasing light extraction efficiency.

According an exemplary embodiment, the protrusions and depressions may be formed on an interface between the substrate 100 and the first conductive semiconductor layer 204. Then, light may be emitted from the active layer 205 via various paths, and thus, light may be less absorbed in a semiconductor layer and a light scattering ratio may increase, thereby increasing light extraction efficiency.

Figure 6A:
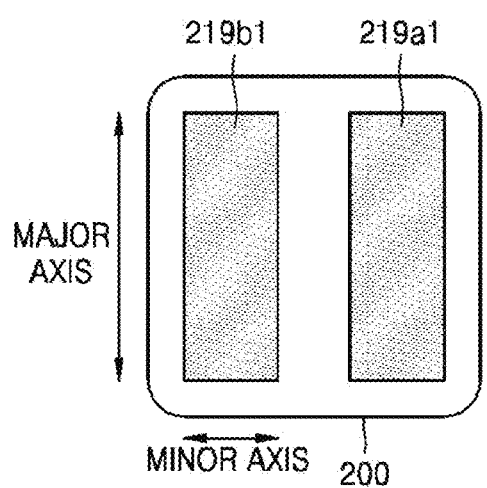
FIGS. 6A and 6B are diagrams of an external connection terminal of an LED package, according to an exemplary embodiment.
Figure 6B:
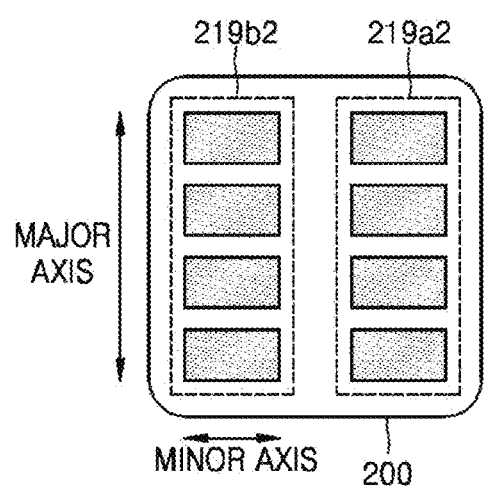

FIGS. 6A and 6B are diagrams of an external connection terminal 219 of the LED package 200, according to an exemplary embodiment.

Referring to FIG. 6A, the LED package 200 includes a first external connection terminal 219a1 and a second external connection terminal 219b1. The first external connection terminal 219a1 is electrically connected with the first electrode structure, and the second external connection terminal 219b1 is electrically connected with the second electrode structure. The first external connection terminal 219a1 and the second external connection terminal 219b1 may be solder bumps. Each of the first and second external connection terminals 219a1 and 219b1 may have a major axis and a minor axis that is perpendicular to the major axis. The major axis may be parallel to the m(10-10) plane of the substrate (100 of FIG. 1) as described above. The first and second external connection terminals 219a1 and 219b1 may be spaced apart by a certain distance. The first external connection terminal 219a1 may include a sub-terminal, and the second external connection terminal 219b1 may include another sub-terminal.

Referring to FIG. 6B, the LED package 200 includes a first external connection terminal 219a2 and a second external connection terminal 219b2. The first and second external connection terminals 219a2 and 219b2 are similar to the first and second external connection terminals 219a1 and 219b1 in FIG. 6A. However, each of the first and second external connection terminals 219a2 and 219b2 of FIG. 6B may include a plurality of sub-terminals. That is, each of the first and second external connection terminals 219a2 and 219b2 may be formed as a group of a plurality of sub-terminals, instead of being formed as a single sub-terminal. In this case also, the group of sub-terminals may have a major axis and a minor axis that is perpendicular to the major axis.

Figure 7:
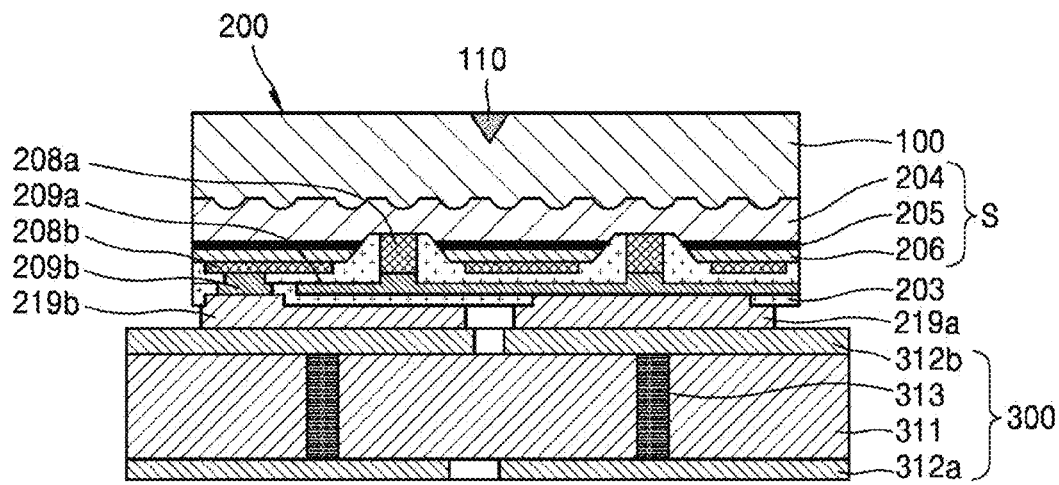
FIG. 7 is a cross-sectional view of a module on which an LED package is mounted, according to an exemplary embodiment.

FIG. 7 is a cross-sectional view of a module 300 on which the LED package 200 is mounted, according to an exemplary embodiment.

Referring to FIG. 7, the LED package 200 is mounted on the module 300. Because the LED package 200 of FIG. 7 is the same as that in FIG. 5, description thereof will not be repeated. The module 300 includes a body 311, an upper electrode layer 312b on an upper surface of the body 311, a lower electrode layer 312a on a lower surface of the body 311, and a via 313 penetrating through the body 311 so that the upper and lower electrode layers 312b and 312a are connected with each other. The body 311 may include resin, ceramic, or metal. Each of the upper and lower electrode layers 312b and 312a may be a metal layer including, for example, Au, Cu, Ag, or Al.

However, the module 300 is not limited to the structure described above. Any structure including wires for driving the LED package 200 may be applied to the module 300. For example, the LED package 200 may be mounted on a lead frame.

Materials included in the first and second external connection terminals 219a and 219b and materials included in the module 300 may have different thermal expansion coefficients. In the exemplary embodiment, compression stress or tension stress may affect the first and second external connection terminals 219a and 219b, and thus cause a notch 110 to be formed in a portion of the substrate 100 that occupies most of the LED package 200. The notch 110 may be formed between the first and second external connection terminals 219a and 219b.

When the notch 110 is formed in the substrate 100, stress may be concentrated on the notch 110. Such stress concentration will be described with reference to FIG. 9. When the notch 110 is formed along the cleaving plane of the substrate 100, cracks may be formed on the substrate 100 via the notch 110. In order to prevent the substrate 100 from cracking, according to the exemplary embodiment, the crystal plane of the substrate 100 between the first and second external connection terminals 219a and 219b, where the notch 110 may be formed, is manufactured so that cracks are not easily spread. In the exemplary embodiment, even when stress is concentrated on the notch 110, because the hardness of the sapphire is high and cracks cannot easily spread, the substrate 100 may be prevented from cracking. Alternatively, greater stress may be necessary for the substrate 100 to crack. Therefore, when manufacturing the LED package 200, manufacturing efficiency may be improved because LEDs may be less damaged due to cracks in the substrate 100, and manufacturing cost may be reduced because of an increase in the manufacturing yield of the LED package 200.

Figure 8A:
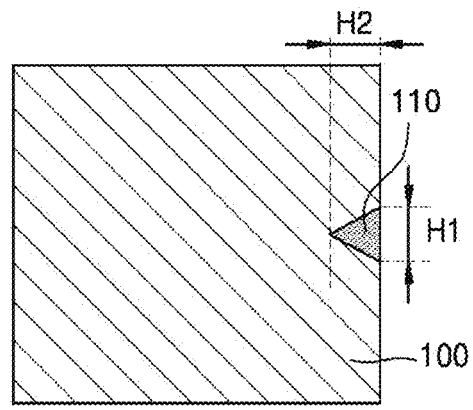
FIGS. 8A and 8B are diagrams of a notch in a substrate for manufacturing an LED package, according to an exemplary embodiment.
Figure 8B:
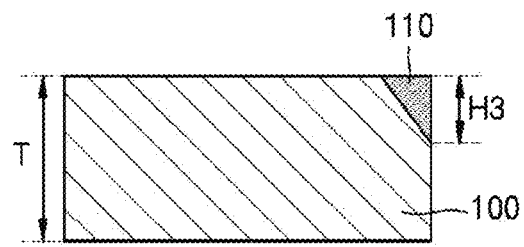

FIGS. 8A and 8B diagrams of the notch 110 in the substrate 100 for manufacturing an LED package, according to an exemplary embodiment.

As described above, various types of substrates may be used to manufacture LEDs. The notch 110 may be formed in the substrate 100 because of external force due to, for example, problems in manufacturing equipment during manufacturing processes, and internal stress due to, for example, a difference between thermal expansion coefficients of material layers formed on the substrate 100. A location and a size of the notch 110 may affect the LEDs. In the drawings, the notch 110 is schematically illustrated as being formed at a side of the substrate 100. The notch 110 may have a 3-dimensional shape with a horizontal length H1, a vertical length H2, and a depth H3. 'T' of FIG. 8B represents a thickness of the substrate 100. However, the notch 110 may be not formed in the substrate 100, or be formed at a side surface and an upper surface on the substrate 100. Hereinafter, an example in which one notch 110 is formed at a side surface of the substrate 100.

FIGS. 9A to 9D are graphs showing a stress test result of the substrate 100 for manufacturing an LED package, according to an exemplary embodiment.

Figure 9A:
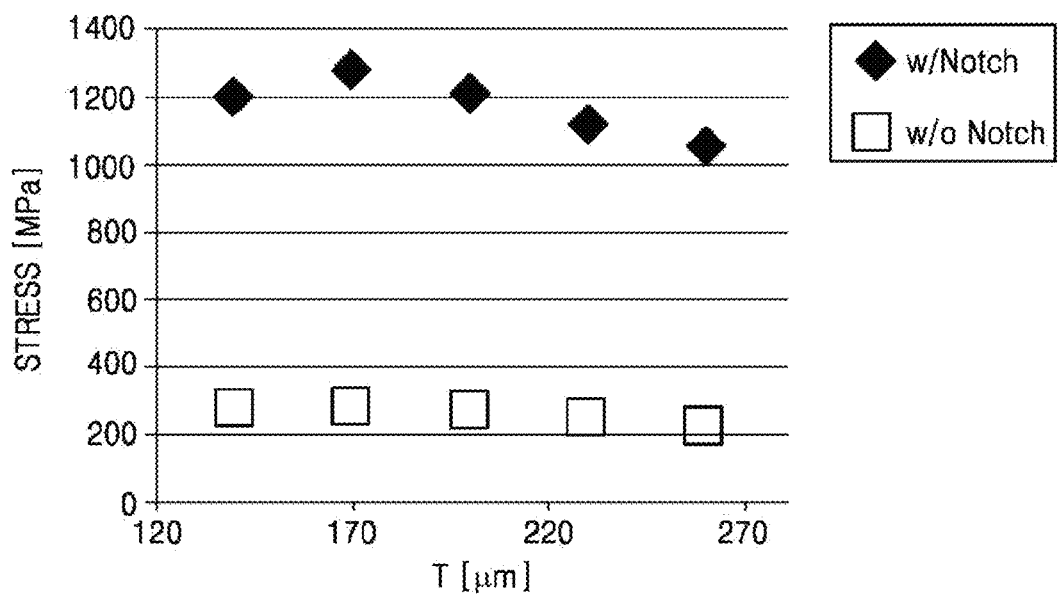
FIGS. 9A to 9D are graphs showing a stress test result of a substrate for manufacturing an LED package, according to an exemplary embodiment.

Referring to FIGS. 8 and 9A, the graph shows stress across the substrate 100 with and without the notch 110 varying depending on the thickness T of the substrate 100. The test was conducted by using a sapphire substrate as the substrate 100. Solder pads are formed on both sides of the substrate 100, and stress across an area of the substrate 100 between the solder pads is measured. Evaluation is conducted at a reflow temperature of solder, i.e., 245° C., under a stress-free condition. A stress value of the notch 110 was measured under a PTC evaluation −45° C. condition. The notch 110 in the substrate 100 has the horizontal length H1 of 30 μm, the vertical length H2 of 15 μm, and the depth H3 of 35 μm.

When the substrate 100 does not have the notch 110, as the thickness T of the substrate 100 increases from the 140 μm to 260 μm, the stress value decreases from 273 MPa to 224 MPa. That is, due to an increase of the thickness T of the substrate 100, stress on the substrate 100 may decrease.

When the substrate 100 has the notch 110, as the thickness T of the substrate 100 increases from the 140 μm to 260 μm, the stress value decreases from 1,284 MPa to 1,054 MPa. That is, due to an increase of the thickness T of the substrate 100, stress on the notch 110 decreases.

According to the test result, stress decreases as the thickness T of the substrate 100 increases. However, because the substrate 100 that is used for manufacturing of an LED has a purpose of forming the LED and transmitting light generated from a light-emission stack, increasing the thickness of the substrate 100 more than a certain thickness may decrease light emission efficiency. Also, it may be relatively more difficult to dice the LEDs formed on the substrate 100 into individual LEDs.

Figure 9B:
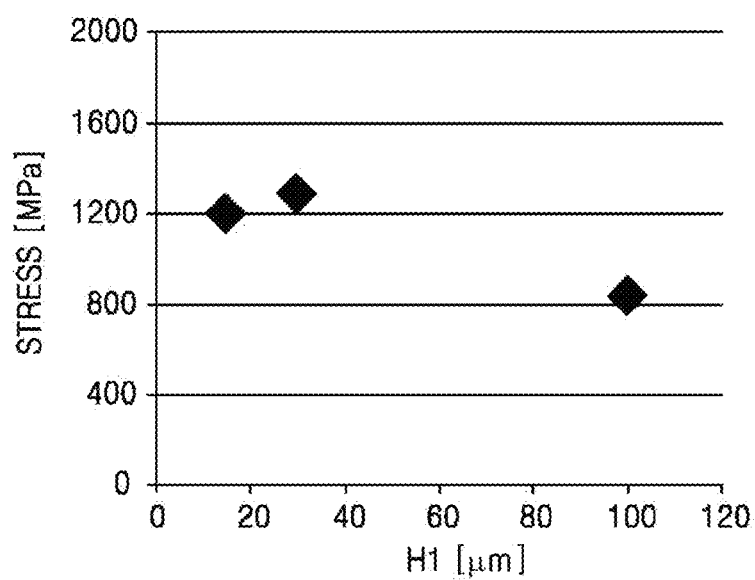
Figure 9C:
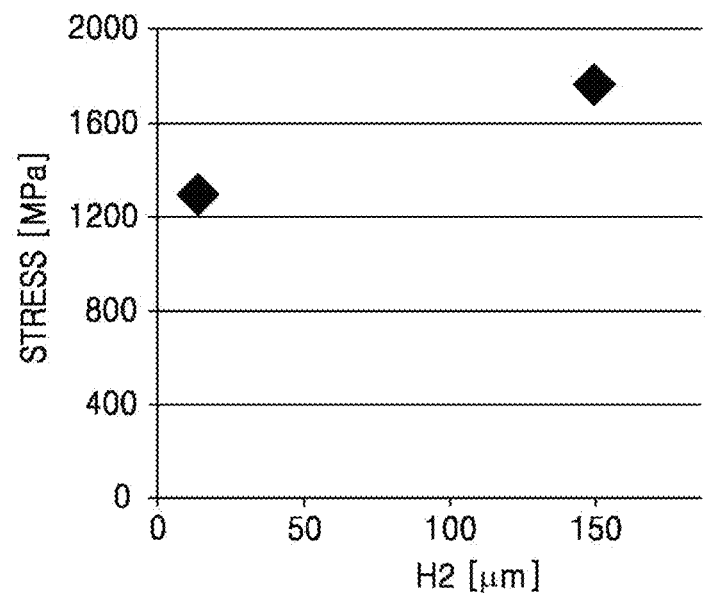
Figure 9D:
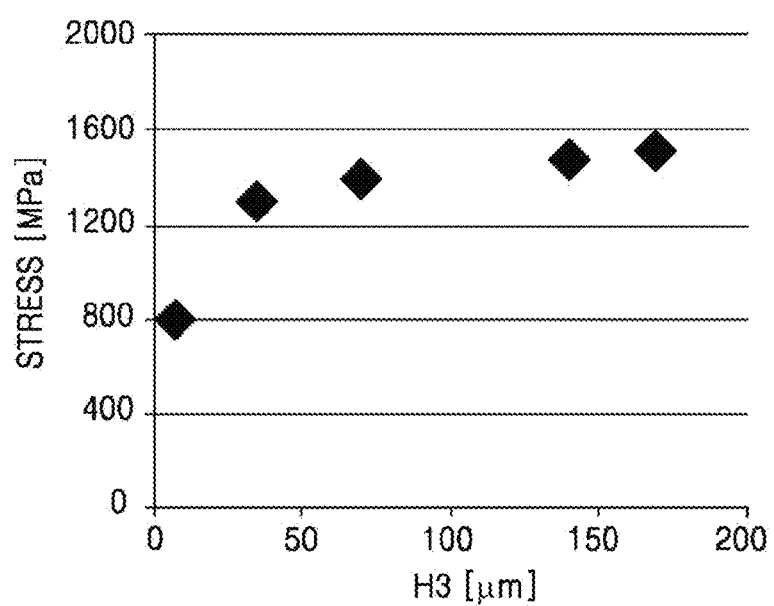

In FIGS. 9B to 9D, stress is measured after forming the notch 110 on the substrate 100 having the thickness of 170 μm. The horizontal length H1, the vertical length H2, or the depth H3 of the notch 110 vary in exemplary embodiments shown in FIGS. 9B to 9D.

Referring to FIGS. 8 and 9B, as the horizontal length H1 of the notch 110 increases from 15 μm to 100 μm, the stress value decreases from 1,284 MPa to 835 MPa. That is, due to an increase in the horizontal length H1, the stress on the notch 110 decreases.

Referring to FIGS. 8 and 9C, as the vertical length H2 of the notch 110 increases from 15 μm to 150 μm, the stress value increases from 1,284 MPa to 1,761 MPa. That is, due to an increase in the vertical length H2, the stress on the notch 110 increases.

Referring to FIGS. 8 and 9D, as the depth H3 of the notch 110 increases from 5 μm to 170 μm, the stress value increases from 790 MPa to 1,501 MPa. That is, due to an increase in the depth H3, the stress on the notch 110 increases.

According to the test result above, more stress is concentrated on the notch 110 when the notch 110 has a sharp shape.

As shown in the drawings, stress of 1 GPa or more may be concentrated on the notch 110 of the substrate 100. That is, even when the thickness of the substrate 100 is increased, stress may be generated due to a difference between respective thermal expansion coefficients of an external connection terminal and a module of an LED package, and stress of 1 GPa or more may affect the sapphire substrate via the notch 110. In this case, cracks may spread via the cleaving plane of the substrate 100, which thus may damage LEDs. Therefore, the LED package according to the exemplary embodiments is proposed.

Figure 10:
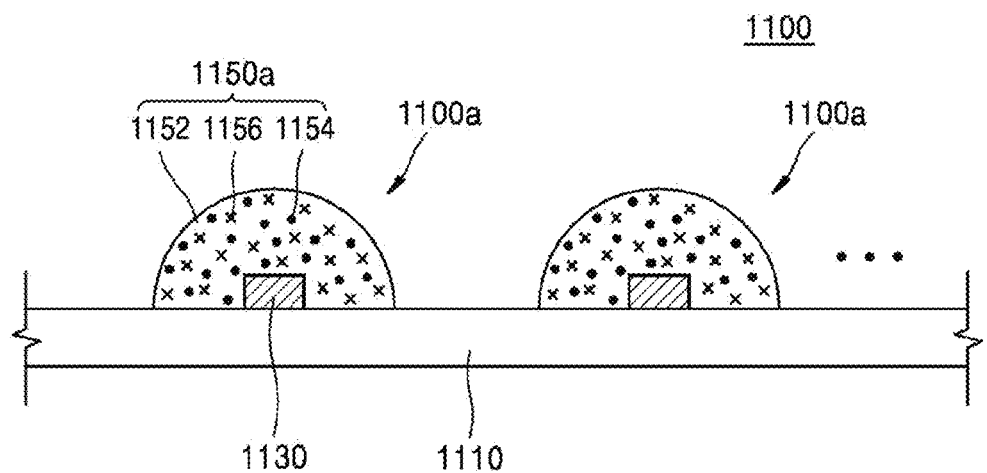
FIGS. 10 and 11 are cross-sectional views of a white light source module including an LED package, according to an exemplary embodiment.
Figure 11:
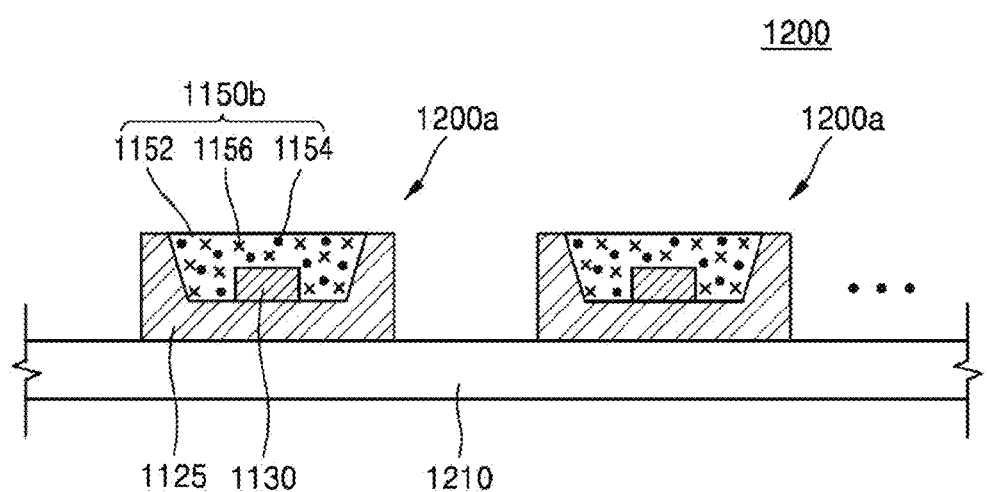

FIGS. 10 and 11 are cross-sectional views of a white light source module 1100 including an LED package, according to an exemplary embodiment.

Referring to FIG. 10, a light source module 1100 for an LCD backlight may include a circuit board 1110 and an array of a plurality of white light-emitting devices 1100a mounted on the circuit board 1110. Conductive patterns connected to the white light-emitting devices 1100a may be formed on the circuit board 1110.

Each of the white light-emitting devices 1100a may be configured such that a light-emitting device 1130 configured to emit blue light is directly mounted on the circuit board 1110 by using a chip on board (COB) method. The light-emitting device 1130 may be the LED package 200 according to the above-described exemplary embodiments. Each of the white light-emitting devices 1100a may exhibit a wide orientation angle because a wavelength conversion unit (wavelength conversion layer) 1150a is formed to have a semi-spherical shape with a lens function. The wide orientation angle may contribute to reducing a thickness or a width of an LCD display.

Referring to FIG. 11, a light source module 1200 for an LCD backlight may include a circuit board 1210 and an array of a plurality of white light-emitting devices 1200a mounted on the circuit board 1210. Each of the white light-emitting devices 1200a may include a blue light-emitting device 1130 mounted in a reflection cup of a package body 1125, and a wavelength conversion unit 1150b that encapsulates the light-emitting device 1130. The light-emitting device 1130 may be the LED package 200 according to the above-described exemplary embodiments.

If necessary, the wavelength conversion units 1150a and 1150b may include wavelength conversion materials 1152, 1154, and 1156 such as phosphors and/or quantum dots. The wavelength conversion materials will be described below.

Figure 12A:
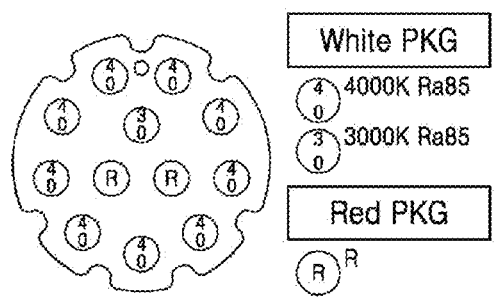
FIGS. 12A and 12B are cross-sectional views of a white light source module, which is adoptable in a lighting device as an LED package, according to an exemplary embodiment.
Figure 12B:
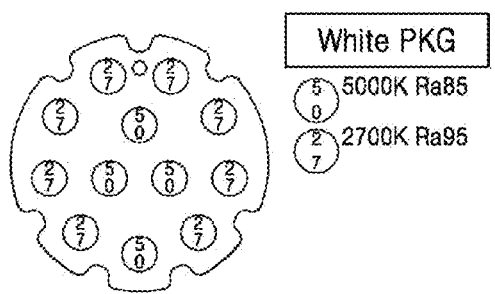
Figure 13:
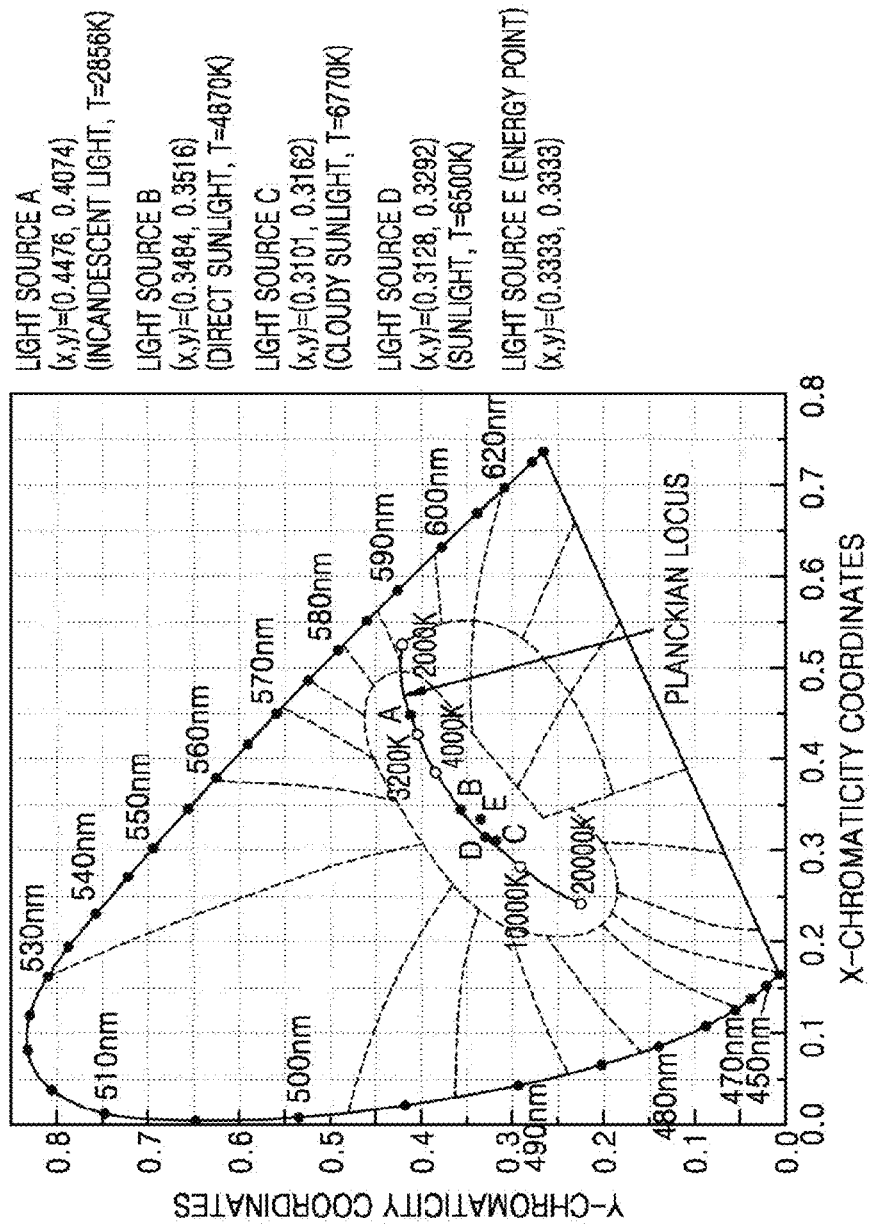
FIG. 13 is a CIE chromaticity diagram showing a perfect radiator spectrum that is usable for an LED package according to an exemplary embodiment.

FIGS. 12A and 12B are cross-sectional views of a white light source module, which is adoptable in a lighting device as an LED package, according to an exemplary embodiment. FIG. 13 is a Commission Internationale de l'Eclairage (CIE) chromaticity diagram showing a perfect radiator spectrum that is usable for an LED package according to an exemplary embodiment.

In an examplary embodiment, each of light source modules shown in FIGS. 12A and 12B may include a plurality of LED packages 30, 40, R, 27, and 50 mounted on a circuit board. The LED packages 30, 40, R, 27, and 50 may be the LED package 200 according to the above-described exemplary embodiments. The LED packages mounted on a single light source module may be the same type of packages that generate light having the same wavelength. However, as in the exemplary embodiment, the LED packages may be different types of packages that generate light having different wavelengths.

Referring to FIG. 12A, the white light source module may be a combination of the white LED packages 40 and 30 having a color temperature of 4,000K and 3,000K and the red LED package R. The white light source module may adjust a color temperature in the range of about 3,000K and about 4,000K and provide white light having a color rendering index (CRI) Ra of about 85 to about 100.

According to an exemplary embodiment, the white light source module includes only white LED packages, but some packages may include white light having different color temperatures. For example, as illustrated in FIG. 12B, it is possible to adjust a color temperature in the range of about 2,700K to about 5,000K and provide white light having a CRI Ra of about 85 to about 99 by combining the white LED package 27 having a color temperature of about 2,700K and the white LED package 50 having a color temperature of about 5,000K. The number of LED packages for each color temperature may be changed according to a basic color temperature setting value. For example, in a lighting apparatus, of which a basic color temperature setting value is around a color temperature of 4,000K, the number of packages corresponding to a color temperature of 4,000K may be larger than the number of packages corresponding to a color temperature of 3,000K or the number of red LED packages.

As such, the different types of LED packages may include an LED package that emits white light by combining a yellow, green, red, or orange-color phosphor with a blue LED. The LED package that emits white light may be configured to include at least one of a violet LED, a blue LED, a green LED, a red LED, and an infrared LED, and thus adjust a color temperature and a CRI of white light.

The single LED package may determine light of a desired color according to a wavelength of an LED chip and a type and a combination ratio of phosphors. In the case of the white light, the color temperature and the CRI may be adjusted.

For example, when the LED chip emits blue light, the LED package including at least one of the yellow, green, and red phosphors may be configured to emit white light having various color temperatures according to a combination ratio of the phosphors. Unlike this, the LED package, in which the green or red phosphor is applied to the blue LED chip, may be configured to emit green or red light. The color temperature and the CRI of the white light may be adjusted by combining the LED package emitting the white light and the LED package emitting the green or red light. In addition, the LED package may include at least one of LEDs emitting the violet, blue, green, red, and infrared light In the exemplary embodiment, the lighting apparatus may adjust the CRI to a photovoltaic level in a sodium (Na) lamp. In addition, the lighting apparatus may generate a variety of white light having a color temperature of about 1,500K to about 20,000K. When necessary, the lighting apparatus may adjust an illumination color according to a surrounding atmosphere or a mood by generating infrared light or visible light such as violet, blue, green, red, or orange color light. In addition, the lighting apparatus may generate light having a specific wavelength so as to promote the growth of plants.

The white light, which is generated by the combination of the yellow, green and red phosphors and/or the green and red LEDs in the blue LED has two or more peak wavelengths. As illustrated in FIG. 13, (x, y) coordinates of the white light in the CIE 1931 coordinate system may be positioned within a line segment connecting coordinates (0.4476, 0.4074), (0.3484, 0.3516), (0.3101, 0.3162), (0.3128, 0.3292), and (0.3333, 0.3333). Alternatively, the (x, y) coordinates may be positioned in a region surrounded by the line segment and a black-body radiator spectrum. The color temperature of the white light is in the range of about 1,500K to about 20,000K. In FIG. 13, because the white light around point E (0.3333, 0.3333) under the black-body radiator spectrum (Planckian locus) is relatively weak in the light of the yellow-based component, it may be used as an illumination light source in a region in which a user may have a more vivid or fresh feeling than naked eyes. Therefore, an illumination product using the white light around point E (0.3333, 0.3333) under the black-body radiator spectrum (Planckian locus) may be suitable as lighting for shopping malls that sell groceries and clothes.

On the other hand, various materials, such as phosphors and/or quantum dots, may be used as a material for converting a wavelength of light emitted by the semiconductor LED.

The phosphor may have the following empirical formulas and colors.

Oxide-based: yellow and green color $Y_3Al_5O_{12}:Ce$, $Tb_3Al_5O_{12}:Ce$, $Lu_3Al_5O_{12}:Ce$ Silicate-based: yellow color and green color $(Ba,Sr)_2SiO_4:Eu$, yellow color and orange color $(Ba,Sr)_3SiO_5:Ce$ Nitride-based: green color $\beta$-SiAlON:Eu, yellow color $La_3Si_6O_{11}:Ce$, orange color $\alpha$-SiAlON:Eu, red color $CaAlSiN_3:Eu$, $Sr_2Si_5N_8:Eu$, $SrSiAl_4N_7:Eu$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) Formula (1)

In Formula (1) of Table 1, Ln may be at least one element selected from the group consisting of group Ma elements and rare-earth elements, and M may be at least one element selected from the group consisting of calcium (Ca), barium (Ba), strontium (Sr), and Mg.

Fluoride-based: KSF-based red color $K_2SiF_6:Mn^{4+}$, $K_2TiF_6:Mn^{4+}$, $NaYF_4:Mn^{4+}$, $NaGdF_4:Mn^{4+}$ (for example, a combination ratio of Mn may be $0 < z \leq 0.17$).

The composition of the phosphor needs to basically conform with stoichiometry, and the respective elements may be substituted by other elements included in the respective groups of the periodic table. For example, strontium (Sr) may be substituted by at least one selected from the group consisting of Ba, Ca, and Mg of alkaline-earth group II, and Y may be substituted by at least one selected from the group terbium (Tb), lutetium (Lu), scandium (Sc), and gadolinium (Gd). In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely or a sub activator may be additionally applied for characteristic modification.

In particular, in order to improve the reliability at a high temperature and high humidity, the fluoride-based red phosphor may be coated with a Mn-free fluoride material or may further include an organic coating on the surface of the phosphor or the coated surface of the Mn-free fluoride material. In the case of the fluoride-based red phosphor, it is possible to implement a narrow half-width of about 40 nm or less unlike other phosphors. Thus, the fluoride-based red phosphor may be applied to a high-resolution TV such as UHD TV.

Table 1 below shows types of phosphors according to applications of a white LED using a blue LED chip (about 440 nm to about 460 nm) or a UV LED chip (about 380 nm to about 440 nm).

TABLE 1

| Usage | Phosphor |
|---|---|
| LED TV BLU | $\beta$-SiAlON: $Eu^{2+}$ |
| | (Ca, Sr)AlSiN3: $Eu^{2+}$ |
| | $La_3Si_6N_{11}$: $Ce^{3+}$ |
| | $K_2SiF_6$: $Mn^{4+}$ |
| | $SrLiAl_3N_4$: Eu |
| | $Ln_{4-x}(Eu_zM_{1-z})_xSi_{12-y}Al_yO_{3+x+y}N_{18-x-y}$ |
| | ($0.5 \le x \le 3$, $0 < z < 0.3$, $0 < y \le 4$) |
| | $K_2TiF_6$: $Mn^{4+}$ |
| | $NaYF_4$: $Mn^{4+}$ |
| | $NaGdF_4$: $Mn^{4+}$ |
| Illumination | $Lu_3Al_5O_{12}$: $Ce^{3+}$ |
| | Ca-$\alpha$-SiAlON: $Eu^{2+}$ |
| | $La_3Si_6N_{11}$: $Ce^{3+}$ |
| | (Ca, Sr)AlSiN3: $Eu^{2+}$ |
| | $Y_3Al_5O_{12}$: $Ce^{3+}$ |
| | $K_2SiF_6$: $Mn^{4+}$ |
| | $SrLiAl_3N_4$: Eu |
| | $Ln_{4-x}(Eu_zM_{1-z})_xSi_{12-y}Al_yO_{3+x+y}N_{18-x-y}$ |
| | ($0.5 \le x \le 3$, $0 < z < 0.3$, $0 < y \le 4$) |
| | $K_2TiF_6$: $Mn^{4+}$ |
| | $NaYF_4$: $Mn^{4+}$ |
| | $NaGdF_4$: $Mn^{4+}$ |
| Side View (Mobile, Note PC) | $Lu_3Al_5O_{12}$: $Ce^{3+}$ |
| | Ca-$\alpha$-SiAlON: $Eu^{2+}$ |
| | $La_3Si_6N_{11}$: $Ce^{3+}$ |
| | (Ca, Sr)AlSiN3: $Eu^{2+}$ |
| | $Y_3Al_5O_{12}$: $Ce^{3+}$ |
| | (Sr, Ba, Ca, Mg)2SiO4: $Eu^{2+}$ |
| | $K_2SiF_6$: $Mn^{4+}$ |
| | $SrLiAl_3N_4$: Eu |
| | $Ln_{4-x}(Eu_zM_{1-z})_xSi_{12-y}Al_yO_{3+x+y}N_{18-x-y}$ |
| | ($0.5 \le x \le 3$, $0 < z < 0.3$, $0 < y \le 4$) |
| | $K_2TiF_6$: $Mn^{4+}$ |
| | $NaYF_4$: $Mn^{4+}$ |
| | $NaGdF_4$: $Mn^{4+}$ |
| Electrical Component (Head Lamp, etc.) | $Lu_3Al_5O_{12}$: $Ce^{3+}$ |
| | Ca-$\alpha$-SiAlON: $Eu^{2+}$ |
| | $La_3Si_6N_{11}$: $Ce^{3+}$ |
| | (Ca, Sr)AlSiN3: $Eu^{2+}$ |
| | $Y_3Al_5O_{12}$: $Ce^{3+}$ |
| | $K_2SiF_6$: $Mn^{4+}$ |
| | $SrLiAl_3N_4$: Eu |
| | $Ln_{4-x}(Eu_zM_{1-z})_xSi_{12-y}Al_yO_{3+x+y}N_{18-x-y}$ |
| | ($0.5 \le x \le 3$, $0 < z < 0.3$, $0 < y \le 4$) |
| | $K_2TiF_6$: $Mn^{4+}$ |
| | $NaYF_4$: $Mn^{4+}$ |
| | $NaGdF_4$: $Mn^{4+}$ |

In addition, the wavelength conversion unit may include wavelength conversion materials such as a quantum dot (QD) by substituting phosphors or combining phosphors.

Figure 14:
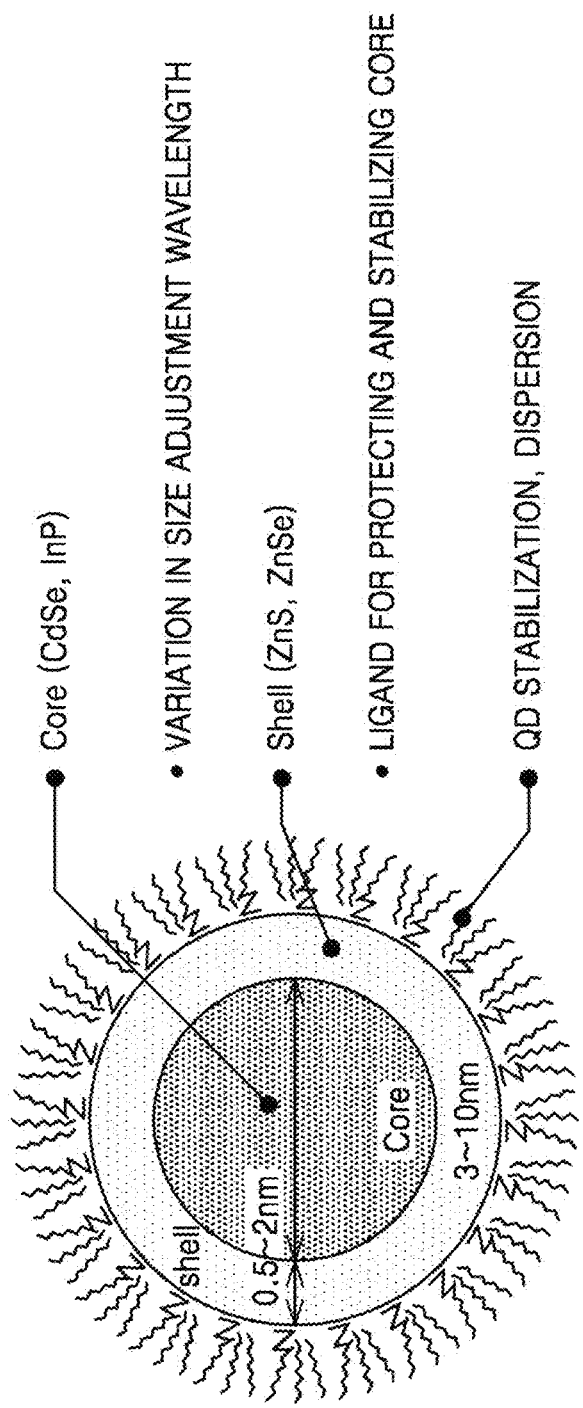
FIG. 14 is a cross-sectional view of a quantum dot as a wavelength conversion material that is usable for an LED package, according to an exemplary embodiment.

FIG. 14 is a cross-sectional view of a QD used as a wavelength conversion material for an LED package, according to exemplary embodiment.

Referring to FIG. 14, the QD may have a core-shell structure using group III-V or II-VI compound semiconductors. For example, QD may have a core such as CdSe or InP and a shell such as ZnS or ZnSe. In addition, the QD may include a ligand for stabilizing the core and the shell. For example, the core may have a diameter of about 1 nm to about 30 nm and specifically about 3 nm to about 10 nm. The shell may have a thickness of about 0.1 nm to about 20 nm and specifically 0.5 nm to about 2 nm.

The QD may implement various colors according to a size. In particular, when the QD is used as a phosphor substitute, the QD may be used as a red or green phosphor. In the case of using the QD, a narrow half-width (for example, about 35 nm) may be implemented.

The wavelength conversion material may be implemented as being contained in an encapsulating material. However, the wavelength conversion material may be previously prepared in a film shape and be attached to a surface of an optical structure such as an LED chip or a light guide plate. In the exemplary embodiment, the wavelength conversion material may be easily applied to a desired region in a structure having a uniform thickness.

Figure 15:
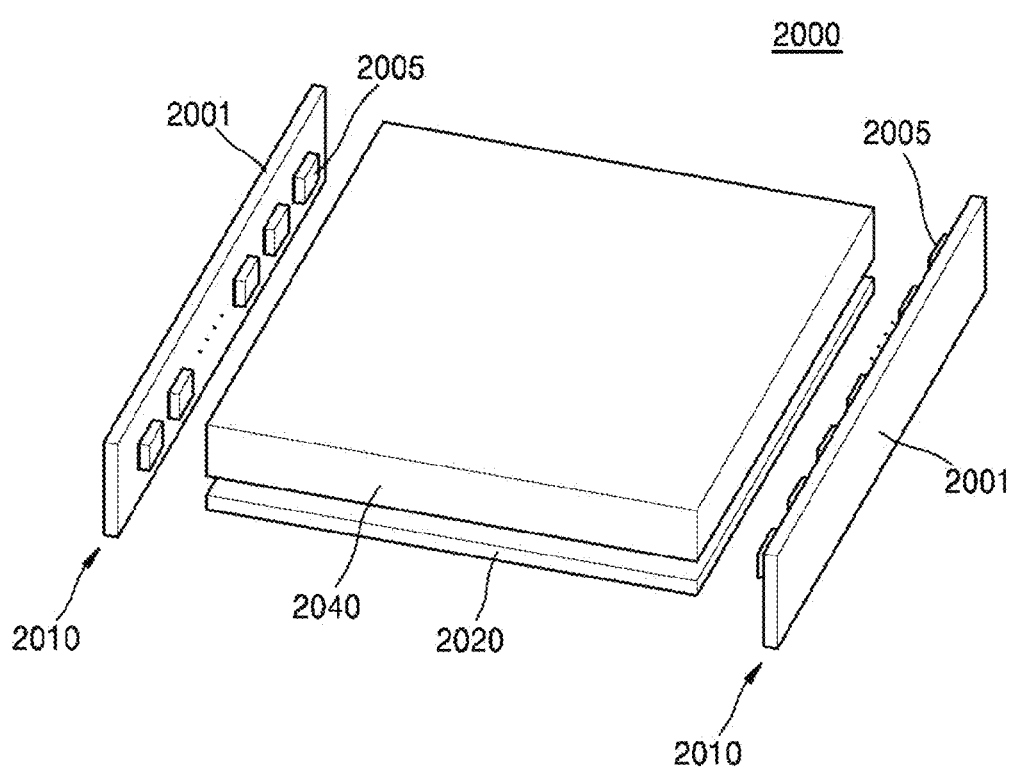
FIG. 15 is a perspective view of a backlight unit including an LED package, according to an exemplary embodiment.

FIG. 15 is a perspective view of a backlight unit 2000 according to an exemplary embodiment.

Referring to FIG. 15, the backlight unit 2000 may include a light guide plate 2040 and light source modules 2010 on both sides of the light guide plate 2040. In addition, the backlight unit 2000 may further include a reflective plate 2020 under the light guide plate 2040. The backlight unit 2000 according to the exemplary embodiment may be an edge-type backlight unit. According to some exemplary embodiments, the light source module 2010 may be provided only one side of the light guide plate 2040 or may be additionally provided on the other side. The light source module 2010 may include a printed circuit board (PCB) 2001 and a plurality of light sources 2005 mounted on the PCB 2001. The light source 2005 may be the LED package 200 according to the above-described exemplary embodiments.

Figure 16:
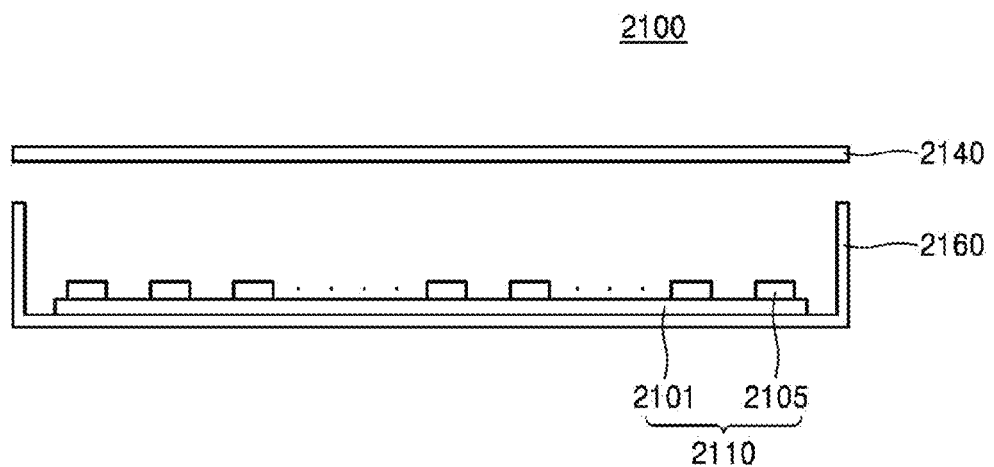
FIG. 16 is a cross-sectional view of a direct-type backlight unit including an LED package, according to an exemplary embodiment.

FIG. 16 is a cross-sectional view of a direct-type backlight unit 2100 according to an exemplary embodiment.

Referring to FIG. 16, the backlight unit 2100 may include a light diffusion plate 2140 and a light source module 2110 under the light diffusion plate 2140. In addition, the backlight unit 2100 may further include a bottom case 2160 under the light diffusion plate 2140 to accommodate the light source module 2110. The backlight unit 2100 according to the exemplary embodiment may be a direct-type backlight unit.

The light source module 2110 may include a PCB 2101 and a plurality of light sources 2105 mounted on the PCB 2101. The light source 2105 may be the LED package 200 according to the above-described exemplary embodiments.

Figure 17:
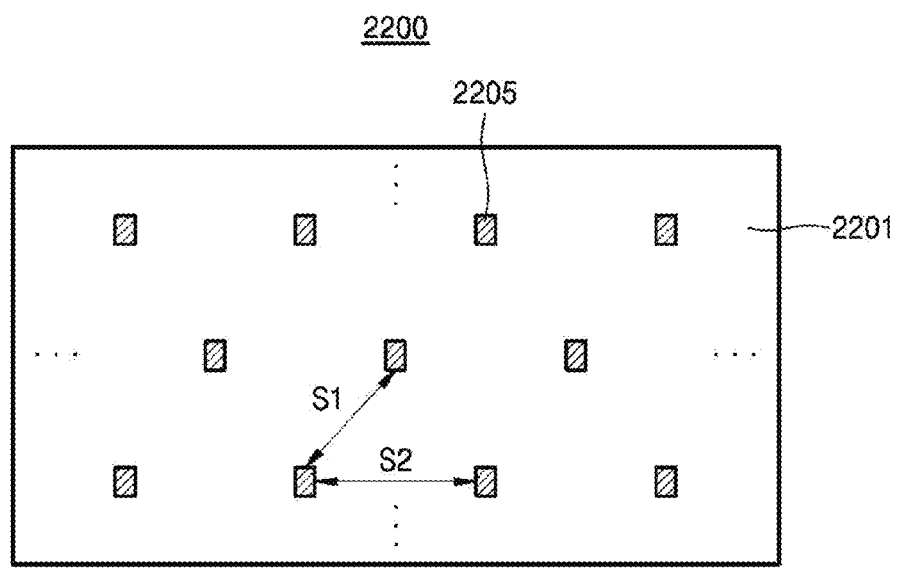
FIG. 17 is a plan view of a backlight unit including an LED package, according to an exemplary embodiment.

FIG. 17 is a plan view of a backlight unit 2200 according to an exemplary embodiment.

FIG. 17 illustrates an example of an arrangement of a light source 2205 in a direct-type backlight unit 2200. The light source 2205 may be the LED package 200 according to the above-described exemplary embodiments.

The direct-type backlight unit 2200 according to the exemplary embodiment may include a plurality of light sources 2205 arranged on a substrate 2201. The light sources 2205 may be arranged in a matrix form, of which rows and columns are in a zigzag arrangement. A second matrix having the same shape may be arranged in a first matrix in which the plurality of light sources 2205 are arranged in rows and columns on a straight line. It may be understood that the light sources 2205 included in the second matrix are inside a rectangle formed by four adjacent light sources 2205 included in the first matrix.

In the direct-type backlight unit, the arrangement structure and intervals of the first matrix and the second matrix may be different so as to further improve brightness uniformity and optical efficiency thereof. Besides the method of arranging the plurality of light sources, distances S1 and S2 between the adjacent light sources may be optimized so as to ensure the brightness uniformity. In this manner, the rows and columns on which the light sources 2205 are arranged may be in a zigzag arrangement, instead of the straight line, thus reducing the number of light sources 2205 by about 15% to about 25% with respect to the same light emission area.

Figure 18:
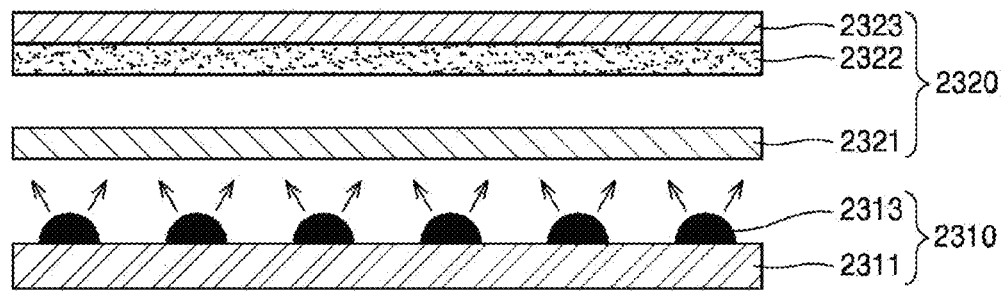
FIG. 18 is a cross-sectional view of a direct-type backlight unit including an LED package, according to an exemplary embodiment.
Figure 19:
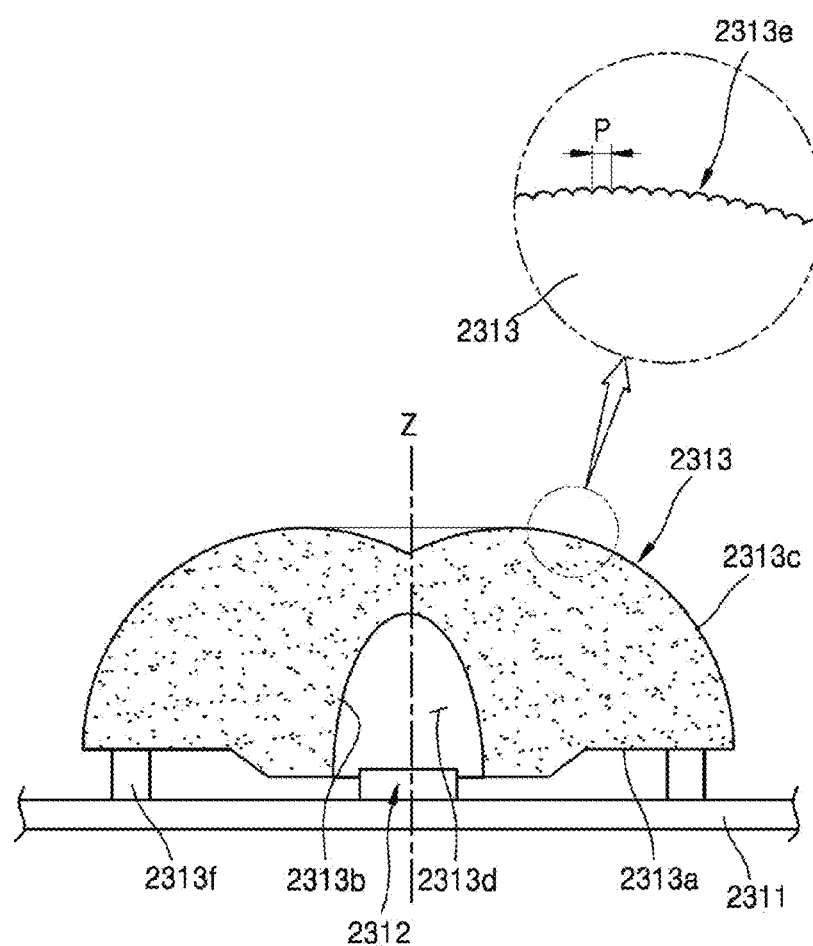
FIG. 19 is an enlarged diagram of a light source module of FIG. 18.

FIG. 18 is a cross-sectional view of a direct-type backlight unit 2300 according to an exemplary embodiment, and FIG. 19 is an enlarged view of a light source module 2310 of FIG. 18.

Referring to FIG. 18, the direct-type backlight unit 2300 according to the exemplary embodiment may include an optical sheet 2320 and a light source module 2310 under the optical sheet 2320. The optical sheet 2320 may include a diffusion sheet 2321, a light concentration sheet 2322, and a protection sheet 2323.

The light source module 2310 may include a circuit board 2311, a plurality of light sources 2312 mounted on the circuit board 2311, and a plurality of optical elements 2313 respectively on the plurality of light sources 2312. The light source 2312 may be the LED package 200 according to the above-described exemplary embodiments.

The optical element 2313 may adjust an orientation angle of light through reflection. In particular, a light orientation-angle lens configured to diffuse light of the light source 2312 to a wide region may be used. Because the light source 2312, to which the optical element 2313 is attached, has a wider light distribution, the number of light sources 2312 per the same area may be reduced when the light source module 2310 is used in a backlight or a flat-panel lighting apparatus.

As illustrated in FIG. 19, the optical element 2313 may include a bottom surface 2313a on the light source 2312, an incidence surface 2313b on which the light of the light source 2312 is incident, and an exit surface 2313c from which the light is output. The bottom surface 2313a of the optical element 2313 may have a groove 2313d recessed in a direction of the exit surface 2313c in a center through which an optical axis Z of the light source 2312 passes. The groove 2313d may be defined as an incidence surface 2313b on which the light of the light source 2312 is incident. That is, the incidence surface 2313b may form a surface of the groove 2313d.

The bottom surface 2313a of the optical element 2313 may partially protrude toward the light source 2312 in a central portion connected to the incidence surface 2313b to thereby have a non-planar structure as a whole. That is, unlike a general flat structure, the entire bottom surface 2313a of the optical element 2313 may partially protrude along a periphery of the groove 2313d. A plurality of supports 2313f may be provided on the bottom surface 2313a of the optical element 2313. When the optical element 2313 is mounted on the circuit board 2311, the plurality of supports 2313f may fix and support the optical element 2313.

The exit surface 2313c of the optical element 2313 may protrude upward (a light exit direction) from an edge connected to the bottom surface 2313a in a dome shape, and have an inflection point such that a center through which the optical axis Z passes is concavely recessed toward the groove 2313d. A plurality of concave/convex portions 2313e may be periodically arranged on the exit surface 2313c in a direction of the edge from the optical axis Z. The plurality of concave/convex portions 2313e may have a ring shape corresponding to a horizontal cross-sectional shape of the optical element 2313 and may form a concentric circle from the optical axis Z. The plurality of concave/convex portions 2313e may be radially arranged while forming periodic patterns along the surface of the exit surface 2313c from the center of the optical axis Z.

The plurality of concave/convex portions 2313e may be spaced apart by regular pitches P to form patterns. In the exemplary embodiment, the pitch P between the plurality of concave/convex portions 2313e may be in the range of about 0.01 mm to about 0.04 mm. The plurality of concave/convex portions 2313e may offset a difference of performance between the optical elements due to a fine processing error that may occur in the process of manufacturing the optical element 2313, and may improve the uniformity of the light distribution accordingly.

Figure 20:
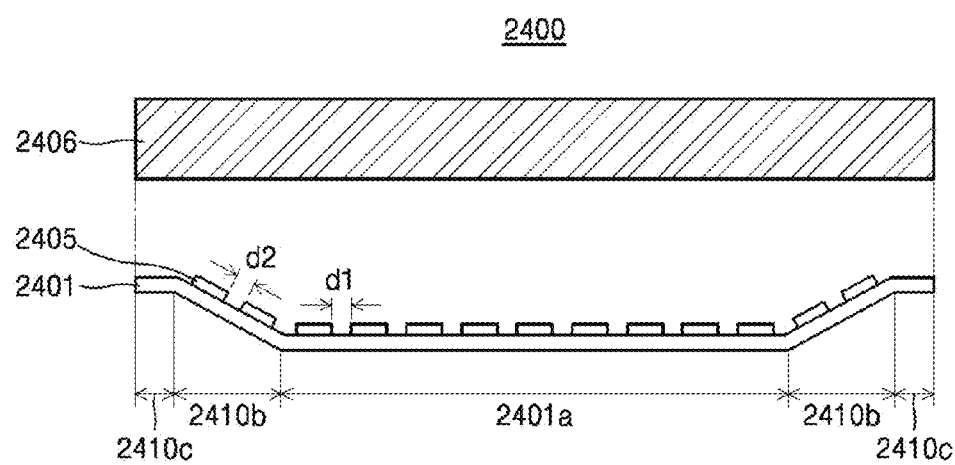
FIG. 20 is a cross-sectional view of a direct-type backlight unit including an LED package, according to an exemplary embodiment.

FIG. 20 is a cross-sectional view of a direct-type backlight unit 2400 according to an exemplary embodiment.

Referring to FIG. 20, the direct-type backlight unit 2400 may include a circuit board 2401, a light source 2405 mounted on the circuit board 2401, and one or more optical sheets 2406 on the light source 2405. The light source 2405 may be a white light-emitting device including a red phosphor. The light source 2405 may be a module mounted on the circuit board 2401. The light source 2405 may be the LED package 200 according to the above-described exemplary embodiments.

The circuit board 2401 may have a first flat portion 2401a corresponding to a main region, an inclined portion 2401b arranged around the first flat portion 2401a and bent in at least a portion thereof, and a second flat portion 2401c arranged at an edge of the circuit board 2401 that is an outside of the inclined portion 2401b. The light sources 2405 may be arranged at a first interval d1 on the first flat portion 2401a, and one or more light sources 2405 may also be arranged at a second interval d2 on the inclined portion 2401b. The first interval d1 may be substantially equal to the second interval d2. A width (or a length in a cross-section) of the inclined portion 2401b may be smaller than a width of the first flat portion 2401a and larger than a width of the second flat portion 2401c. In addition, at least one light source 2405 may be arranged on the second flat portion 2401c when necessary.

A slope of the inclined portion 2401b may be appropriately adjusted in the range of greater than 0° and less than 90° with reference to the first flat portion 2401a. Due to such a configuration, the circuit board 2401 may maintain uniform brightness even at the edge of the optical sheet 2406.

Figure 21:
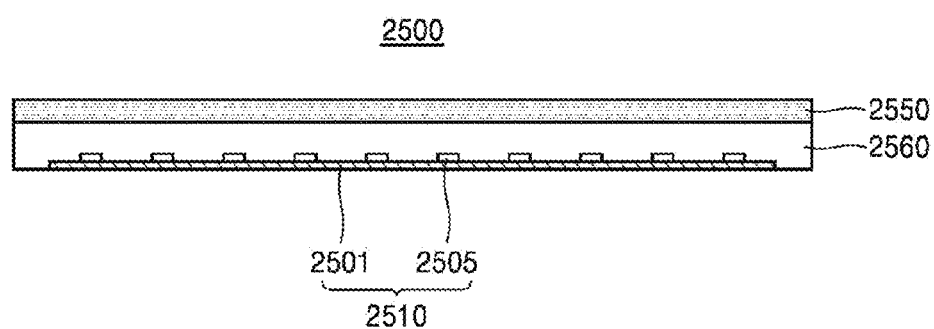
FIGS. 21 to 23 are cross-sectional views of a direct-type backlight unit including an LED package, according to an exemplary embodiment.
Figure 22:
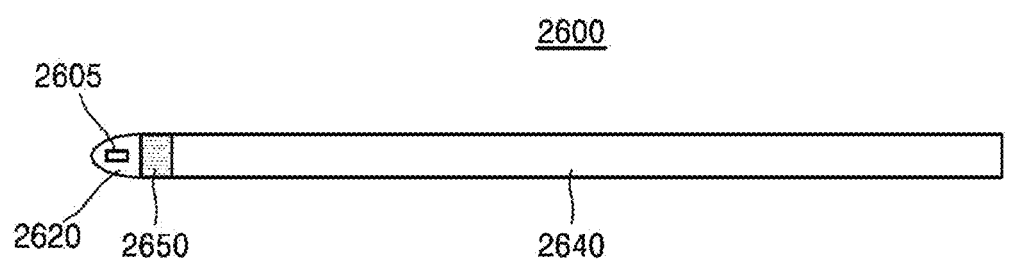
Figure 23:
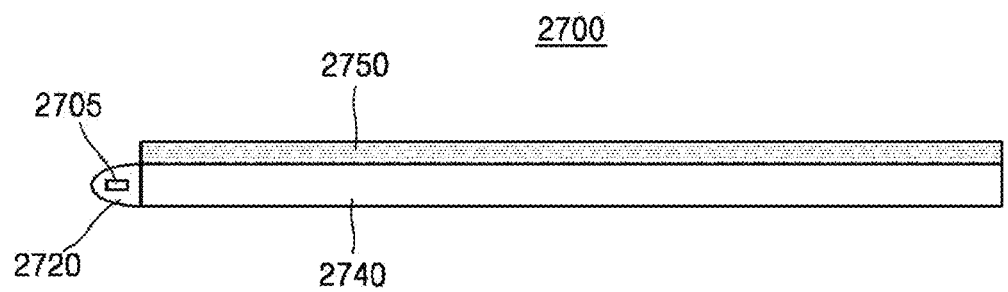

FIGS. 21 to 23 are cross-sectional views of backlight units 2500, 2600, and 2700 according to exemplary embodiments of the inventive concept.

In the backlight units 2500, 2600, and 2700, wavelength conversion units 2550, 2650, and 2750 are not arranged in light sources 2505, 2605, and 2705. The wavelength conversion units 2550, 2650, and 2750 are arranged in the backlight units 2500, 2600, and 2700 outside the light sources 2505, 2605, and 2705 so as to convert light. The light sources 2505, 2605, and 2705 may be the LED package 200 according to the above-described exemplary embodiments.

The backlight unit 2500 of FIG. 21 is a direct-type backlight unit and may include the wavelength conversion unit 2550, a light source module 2510 under the wavelength conversion unit 2550, and a bottom case 2560 accommodating the light source module 2510. In addition, the light source module 2510 may include a PCB 2501 and a plurality of light sources 2505 mounted on the PCB 2501.

In the backlight unit 2500, the wavelength conversion unit 2550 may be on the bottom case 2560. Therefore, at least a part of the light emitted by the light source module 2510 may be wavelength-converted by the wavelength conversion unit 2550. The wavelength conversion unit 2550 may be manufactured as a separate film and may be integrated with a light diffusion plate (not shown).

The backlight units 2600 and 2700 of FIGS. 22 and 23 are edge-type backlight units and may include the wavelength conversion unit 2650 and 2750, light guide plates 2640 and 2740, and reflection units 2620 and 2720 and light sources 2605 and 2705 arranged on one side of the light guide plates 2640 and 2740. The light emitted by the light sources 2605 and 2705 may be guided inside the light guide plates 2640 and 2740 by the reflection units 2620 and 2720. In the backlight unit 2600 of FIG. 22, the wavelength conversion unit 2650 may be arranged between the light guide plate 2640 and the light source 2605. In the backlight unit 2700 of FIG. 23, the wavelength conversion unit 2750 may be on a light emission surface of the light guide plate 2740.

The wavelength conversion units 2550, 2650, and 2750 may include typical phosphors. In particular, QD phosphors may be used for supplementing characteristics of QDs vulnerable to moisture or heat from the light source.

Figure 24:
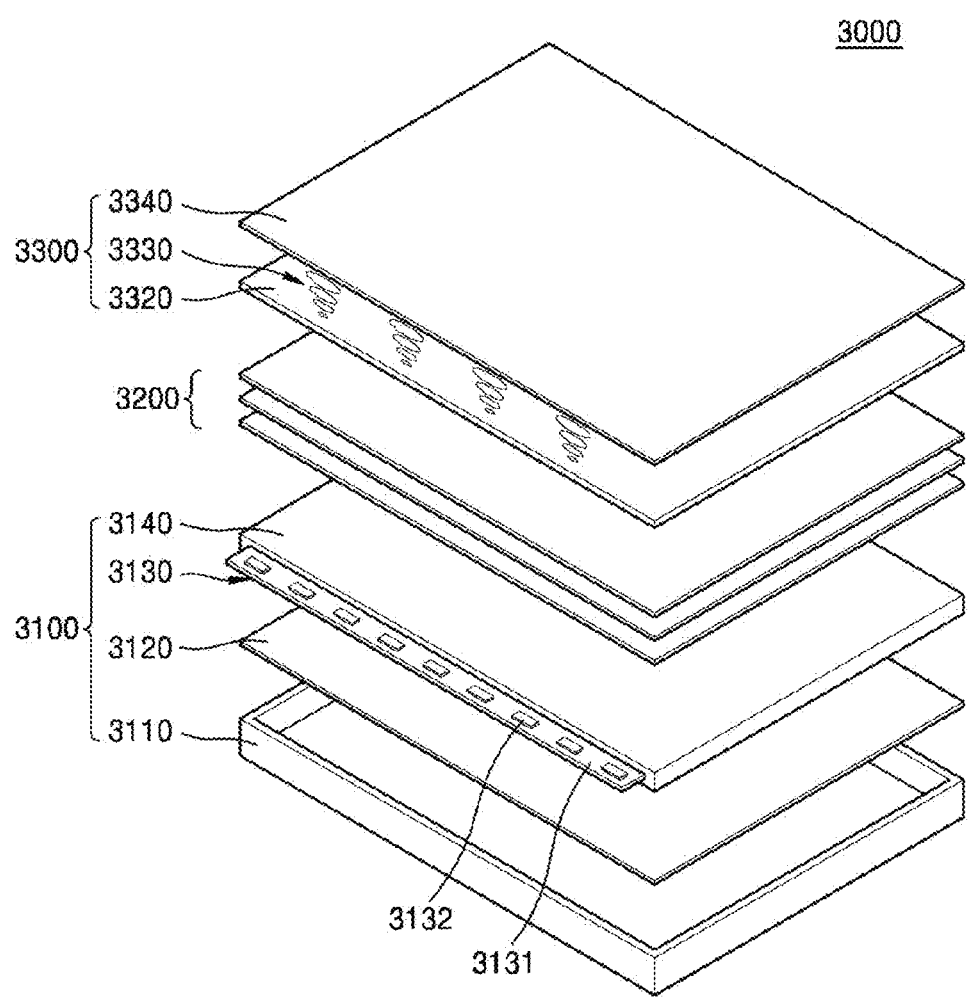
FIG. 24 is an exploded perspective view of a display apparatus including an LED package, according to an exemplary embodiment.

FIG. 24 is an exploded perspective view of a display device 3000 according to an exemplary embodiment.

Referring to FIG. 24, the display device 3000 may include a backlight unit 3100, an optical sheet 3200, and a display panel 3300 such as a liquid crystal panel. The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132.

In particular, the light source 3132 may be a side view type LED mounted on a side adjacent to a light emission surface. The light source 3132 may be the LED package 200 according to the above-described exemplary embodiments. The optical sheet 3200 may be between the light guide plate 3140 and the display panel 3300 and may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in a matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

According to the exemplary embodiment, because the display device 3000 uses the light source 3132 configured to emit blue light, green light, and red light having a relatively small half-width, the emitted light may implement blue, green, and red colors having a high color purity after passing through the color filter substrate 3340.

Figure 25:
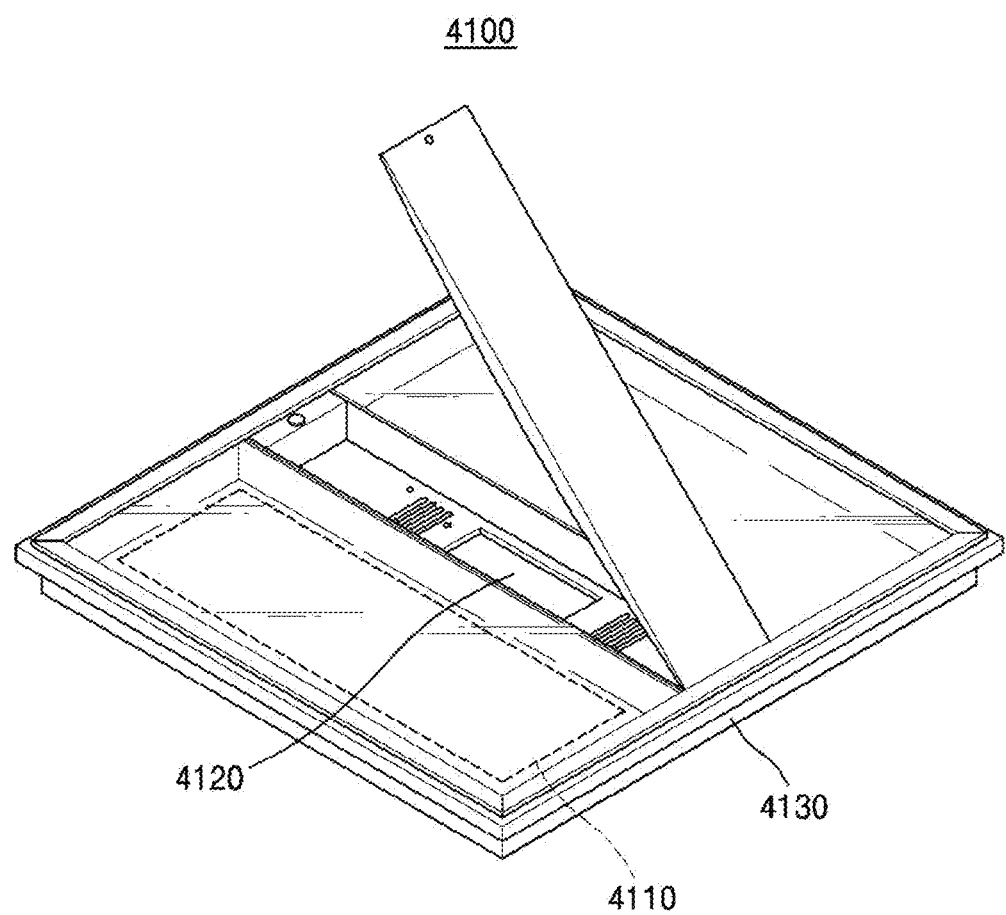
FIG. 25 is a perspective view of a flat-panel lighting device including an LED package, according to an exemplary embodiment.

FIG. 25 is a perspective view of a flat-panel lighting apparatus 4100 according to an exemplary embodiment.

Referring to FIG. 25, the flat-panel lighting apparatus 4100 may include a light source module 4110, a power supply 4120, and a housing 4030. According to the exemplary embodiment, the light source module 4110 may include an LED array as a light source. The light source module 4110 may be the LED package 200 according to the above-described exemplary embodiments. The power supply 4120 may include an LED driver.

The light source module 4110 may include an LED array and may be formed to have a flat shape as a whole. According to the exemplary embodiment, the LED array may include an LED and a controller configured to store driving information of the LED.

The power supply 4120 may be configured to supply power to the light source module 4110. The housing 4130 may form an accommodation space for accommodating the light source module 4110 and the power supply 4120. The housing 4130 is formed to have a hexahedral shape with one opened side, but is not limited thereto. The light source module 4110 may be arranged to emit light toward the opened side of the housing 4130.

Figure 26:
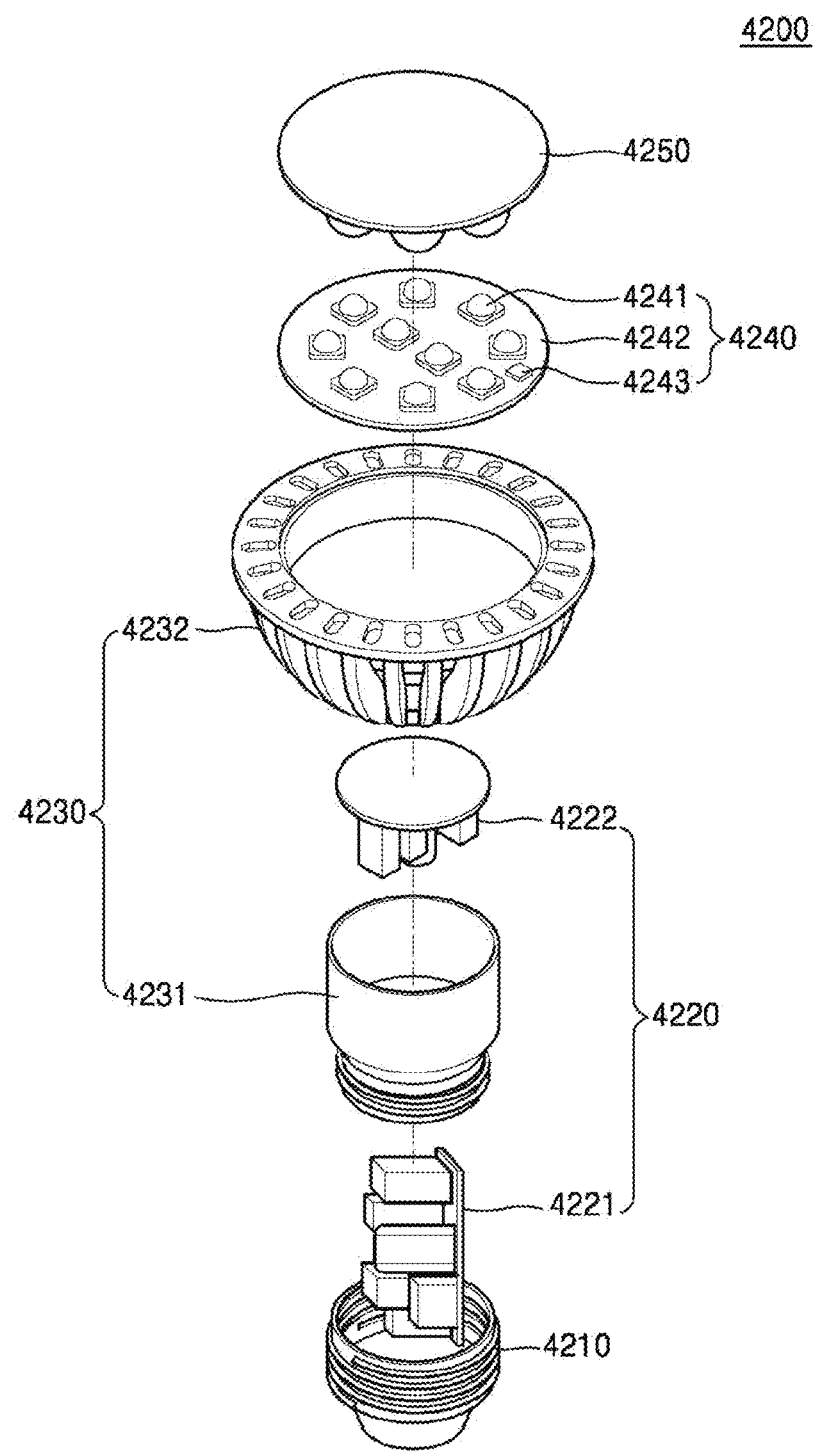
FIG. 26 is an exploded perspective view of a lighting device including an LED package, according to an exemplary embodiment.

FIG. 26 is an exploded perspective view of a lighting apparatus 4200 according to an exemplary embodiment.

Referring to FIG. 26, the lighting apparatus 4200 may include a socket 4210, a power supply 4220, a heat sink 4230, a light source module 4240, and an optical unit 4250. According to the exemplary embodiment, the light source module 4240 may include an LED array, and the power supply 4220 may include an LED driver.

The socket 4210 may be configured to be replaceable with an existing lighting apparatus. Power may be supplied to the lighting apparatus 4200 through the socket 4210. The power supply 4220 may be dissembled into a first power supply 4221 and a second power supply 4220. The heat sink 4230 may include an internal heat sink 4231 and an external heat sink 4232. The internal heat sink 4231 may be directly connected to the light source module 4240 and/or the power supply 4220. The internal heat sink 4231 may transmit heat to the external heat sink 4232. The optical unit 4250 may include an internal optical unit (not illustrated) and an external optical unit (not illustrated). The optical unit 4250 may be configured to uniformly disperse light emitted by the light source module 4240.

The light source module 4240 may receive power from the power supply 4220 and emit light to the optical unit 4250. The light source module 4240 may include one or more LED packages 4241, a circuit board 4242, and controller 4243. The controller 4243 may store driving information of the LED packages 4241. The LED packages 4241 may be the LED package 200 according to the above-described exemplary embodiments.

Figure 27:
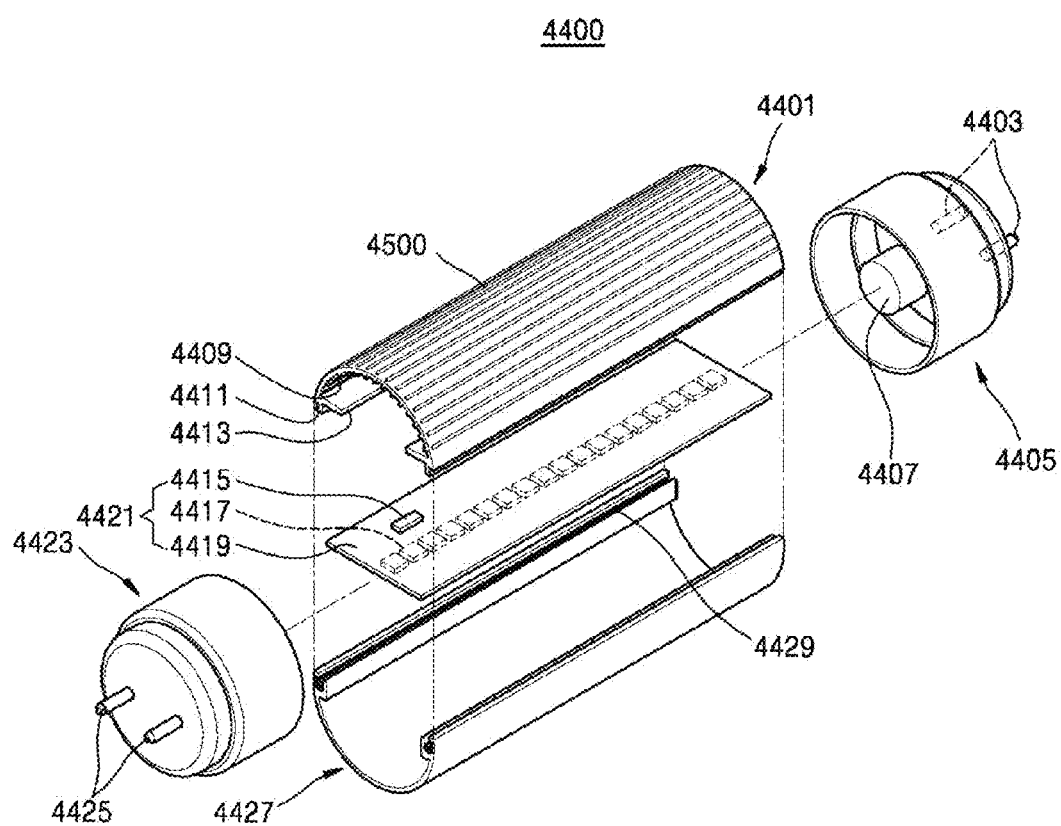
FIG. 27 is an exploded perspective view of a bar-type lighting device including an LED package, according to an exemplary embodiment.

FIG. 27 is an exploded perspective view of a bar-type lighting apparatus 4400 according to an exemplary embodiment.

Referring to FIG. 27, the bar-type lighting apparatus 4400 may include a heat sink member 4401, a cover 4427, a light source module 4421, a first socket 4405, and a second socket 4423. A plurality of heat sink fins 4500 and 4409 having a concave/convex shape may be formed on inner or outer surfaces of the heat sink member 4401. The heat sink fins 4500 and 4409 may be designed to have various shapes and intervals. A support 4413 having a protruding shape may be formed inside the heat sink member 4401. The light source module 4421 may be fixed to the support 4413. Locking protrusions 4411 may be formed on both ends of the heat sink member 4401.

Locking grooves 4429 may be formed in the cover 4427. The locking protrusions 4411 of the heat sink member 4401 may be hooked to the locking grooves 4429. The positions of the locking grooves 4429 may be exchanged with the positions of the locking protrusions 4411.

The light source module 4421 may include an LED array. The light source module 4421 may include a PCB 4419, a light source 4417, and a controller 4415. The controller 4415 may store driving information of the light source 4417. Circuit wirings may be formed on the PCB 4419 so as to operate the light source 4417. In addition, the light source module 4421 may include components for operating the light source 4417. The light source 4417 may be at least one of the above-described LED packages 100, 100a, 100b, 100c, 100d, and 100e according to the exemplary embodiments.

The first and second sockets 4405 and 4423 may be provided as a pair of sockets and may be connected to both ends of a cylindrical cover unit including the heat sink member 4401 and the cover 4427. For example, the first socket 4405 may include an electrode terminal 4403 and a power supply 4407, and the second socket 4423 may include a dummy terminal 4425. In addition, an optical sensor module and/or a communication module may be embedded into the first socket 4405 or the second socket 4423. For example, the optical sensor module and/or the communication module may be embedded into the second socket 4423 in which the dummy terminal 4425 is arranged. As an example, the optical sensor module and/or the communication module may be embedded into the first socket 4405 in which the electrode terminal 4403 is arranged.

Figure 28:
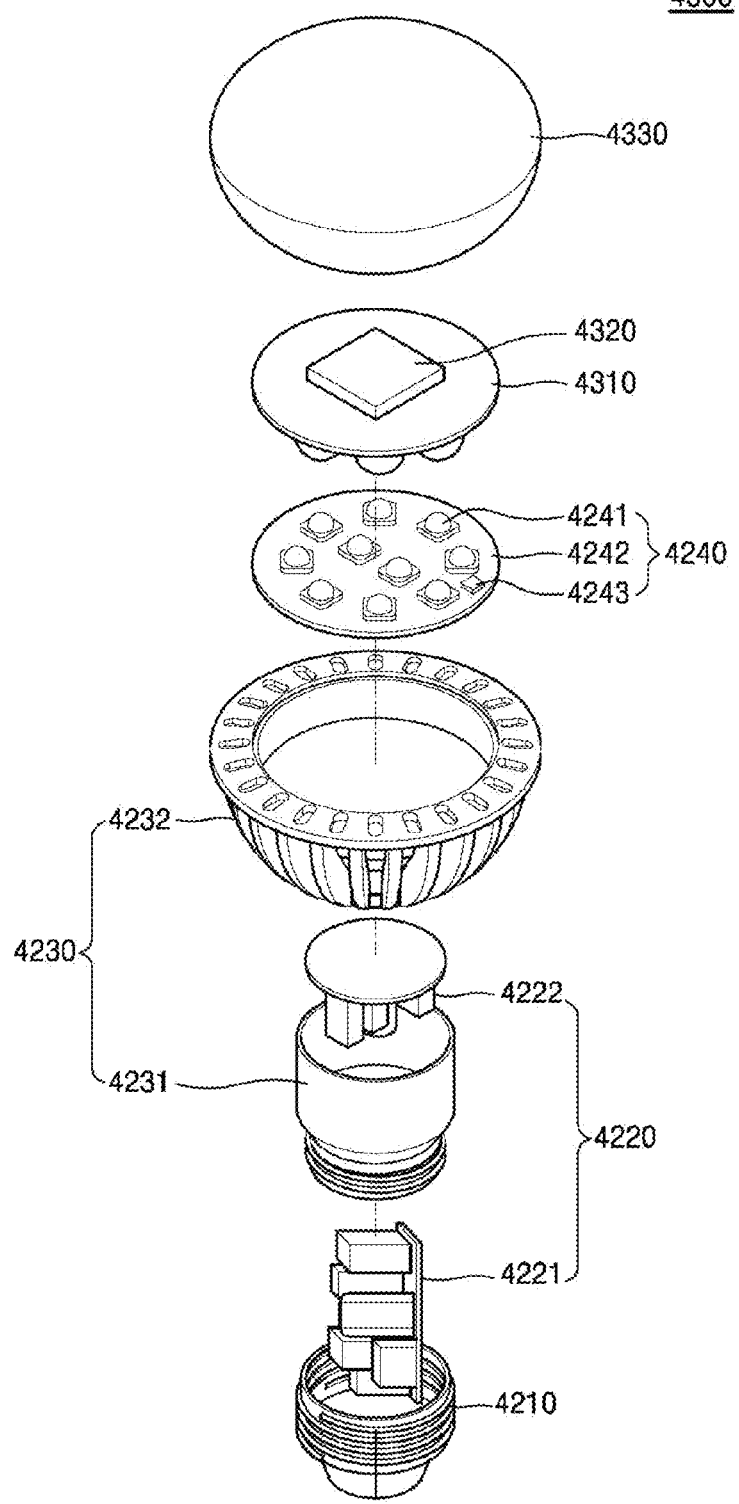
FIG. 28 is an exploded perspective view of a lighting device including an LED package, according to an exemplary embodiment.

FIG. 28 is an exploded perspective view of a lighting apparatus 4500 according to an exemplary embodiment.

The lighting apparatus 4500 of FIG. 28 differs from the lighting apparatus 4200 of FIG. 26 in that a reflection plate 4310 and a communication module 4320 are provided on a light source module 4240. The reflection plate 4310 may uniformly disperse light from the light source in a lateral direction and a rearward direction so as to reduce glare.

The communication module 4320 may be mounted on the reflection plate 4310, and a home network communication may be performed through the communication module 4320. For example, the communication module 4320 may be a wireless communication module using ZigBee, WiFi, or LiFi, and control an indoor or outdoor lighting apparatus, such as on/off operations or brightness adjustment of the lighting apparatus through a smartphone or a wireless controller. In addition, electronic appliances and vehicle systems, such as TVs, refrigerators, air conditioners, doorlock systems, vehicles, may be controlled through a LiFi communication module using a wavelength of visible light in the indoor or outdoor lighting apparatus. The reflection plate 4310 and the communication module 4320 may be covered by the cover 4330.

Figure 29:
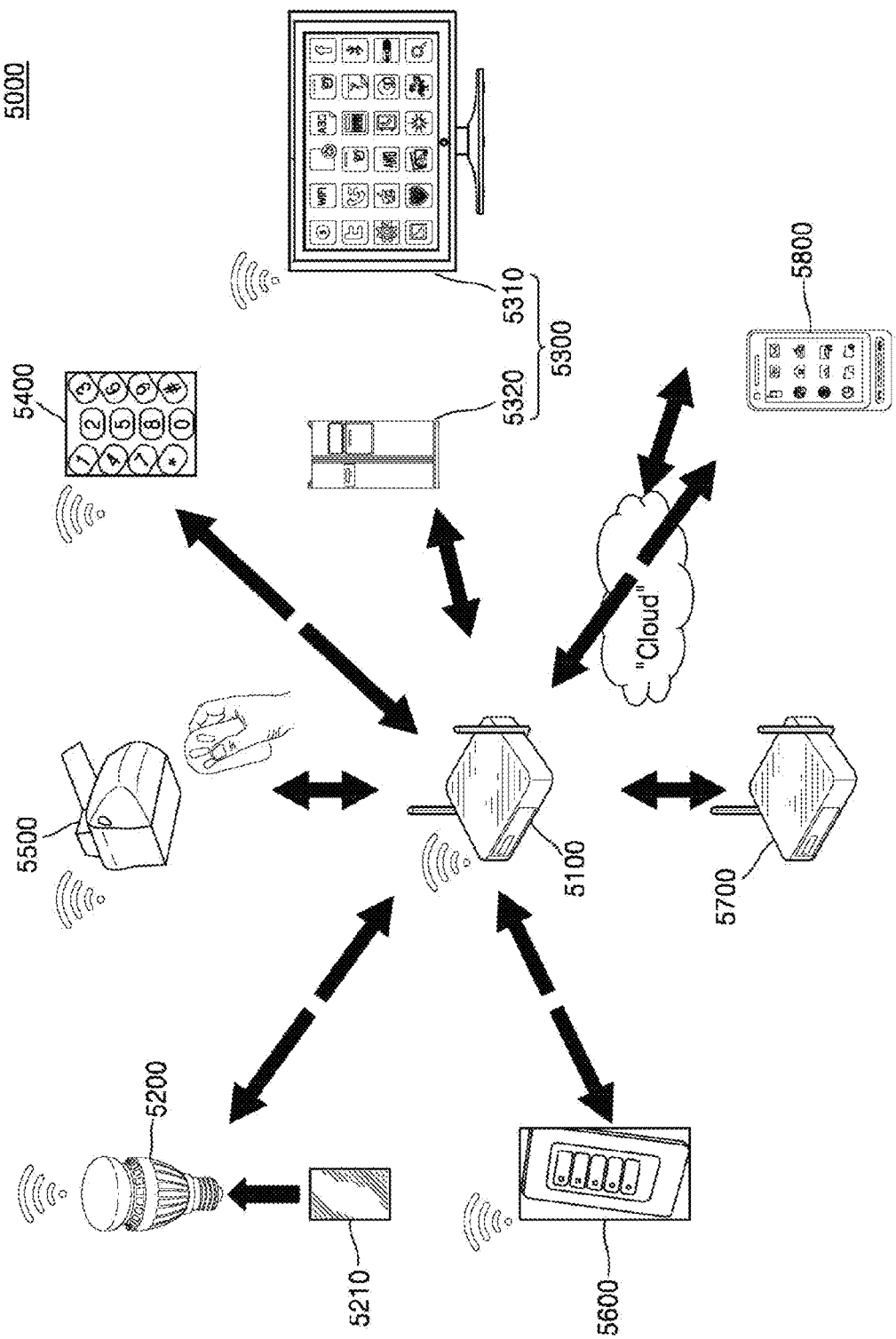
FIG. 29 is a schematic diagram of an indoor light control network system including an LED package, according to an exemplary embodiment.

FIG. 29 is a diagram for describing an indoor lighting control network system 5000 according to an exemplary embodiment.

Referring to FIG. 29, the indoor lighting control network system 5000 may be a composite smart lighting-network system in which a illumination technology using an LED, an Internet of Things (IoT) technology, a wireless communication technology converge. The network system 5000 may be implemented using various lighting apparatuses and wired/wireless communication devices, and may be implemented by a sensor, a controller, a communication device, and software for network control and maintenance.

The network system 5000 may be applied to a closed space defined in buildings such as offices, an open space such as parks or streets, and the like. The network system 5000 may be implemented based on an IoT environment so as to collect, process, and provide a variety of information to users.

An LED lamp 5200 included in the network system 5000 may receive information about an ambient environment from a gateway 5100 and control illumination of the LED lamp 5200 itself. Furthermore, the LED lamp 5200 may check and control the operation states of other devices 5300 to 5800 included in the IoT environment based on a visible light communication function of the LED lamp 5200. The LED lamp 5200 may be the LED package 200 according to the above-described exemplary embodiments.

The network system 5000 may include the gateway 5100 configured to process data transmitted and received in accordance with different communication protocols, the LED lamp 5200 communicably connected to the gateway 5100 and including an LED, and a plurality of devices 5300 to 5800 communicably connected to the gateway 5100 in accordance with various wireless communication schemes. In order to implement the network system 5000 based on the IoT environment, the devices 5300 to 5800, including the LED lamp 5200, may include at least one communication module. According to the exemplary embodiment, the LED lamp 5200 may be communicably connected to the gateway 5100 by the wireless communication protocol such as WiFi, ZigBee, or LiFi. To this end, the LED lamp 5200 may include at least one lamp communication module 5210.

The network system 5000 may be applied to a closed space such as homes or offices, an open space such as parks or streets, and the like. In a case where the network system 5000 is applied to the home, the plurality of devices 5300 to 5800, which are included in the network system 5000 and communicably connected to the gateway 5100 based on the IoT technology, may include electronic appliances 5300, a digital doorlock 5400, a garage doorlock 5500, a lighting switch 5600 installed on a wall, a router 5700 for relaying a wireless communication network, and mobile devices 5800 such as smartphones, tablets, or laptop computers.

In the network system 5000, the LED lamp 5200 may check the operation states of the various devices 5300 to 5800 or automatically control the illumination of the LED lamp 5200 itself according to the ambient environment and conditions by using the wireless communication network (e.g., ZigBee, WiFi, LiFi, etc.) installed at home. In addition, the LED lamp 5200 may control the devices 5300 to 5800 included in the network system 5000 through the LiFi communication using the visible light emitted by the LED lamp 5200.

The LED lamp 5200 may automatically control the illumination of the LED lamp 5200 based on the information about the ambient environment, which is transmitted from the gateway 5100 through the lamp communication module 5210, or the information about the ambient environment, which is collected from the sensor mounted on the LED lamp 5200. For example, the brightness of the LED lamp 5200 may be automatically adjusted according to a kind of a TV program aired on the TV 5310 or a screen brightness of the TV 5310. To this end, the LED lamp 5200 may receive operation information of the TV 5310 from the lamp communication module 5210 connected to the gateway 5100. The lamp communication module 5210 may be integrally modularized with the sensor and/or the controller included in the LED lamp 5200.

For example, when a program value of a TV program is a human drama, the LED lamp 5200 may lower a color temperature to 12,000K or less (e.g., 5,000K) and adjust a color sense according to a preset value, thus creating a cozy atmosphere. On the other hand, when a program value is a gag program, the LED lamp 5200 may increase a color temperature to 5,000K or more according to a set value so as to be adjusted to bluish white light.

In addition, after elapse of a predetermined time after the digital doorlock 5400 has been locked in such a state that there is no person at home, it is possible to prevent waste of electricity by turning off the turned-on LED lamp 5200. Alternatively, in a case where a security mode is set through the mobile device 5800 or the like, when the digital doorlock 5400 is locked in such a state that there is no person at home, the LED lamp 5200 may maintain the turned-on state.

The operation of the LED lamp 5200 may be controlled according to information about the ambient environment, which is collected through various sensors connected to the network system 5000. For example, in a case where the network system 5000 is implemented in a building, it is possible to turn on or off the illumination by combining a lighting apparatus, a position sensor, and a communication module within the building, or provide collected information in real time, thus enabling efficient facility management or efficient utilization of unused space. Because the lighting apparatus such as the LED lamp 5200 is usually arranged in almost all spaces of each floor in the building, a variety of information about the building may be collected through a sensor integrally provided with the LED lamp 5200, and the collected information may be used for facility management and utilization of unused spaces.

On the other hand, by combining the LED lamp 5200 with an image sensor, a storage device, the lamp communication module 5210, or the like, the LED lamp 5200 may be used as a device capable of maintaining building security or sensing and counteracting emergency situations. For example, when a smoke or temperature sensor is attached to the LED lamp 5200, it is possible to promptly detect an outbreak of fire, thus minimizing fire damage. In addition, it is possible to adjust the brightness of the lighting apparatus, save energy, and provide a pleasant illumination environment, taking into consideration outside weather or amount of sunshine.

As described above, the network system 5000 may be applied to a closed space such as homes, offices, or buildings, an open space such as parks or streets, and the like. In a case where the network system 5000 is intended to apply to an open space without physical limitations, it may be relatively difficult to implement the network system 5000 due to a distance limitation of wireless communication and a communication interference caused by various obstacles. By mounting the sensors and the communication modules on various lighting apparatuses and using the lighting apparatuses as information collection units and communication relay units, the network system 5000 may be more efficiently implemented in the open environments.

Figure 30:
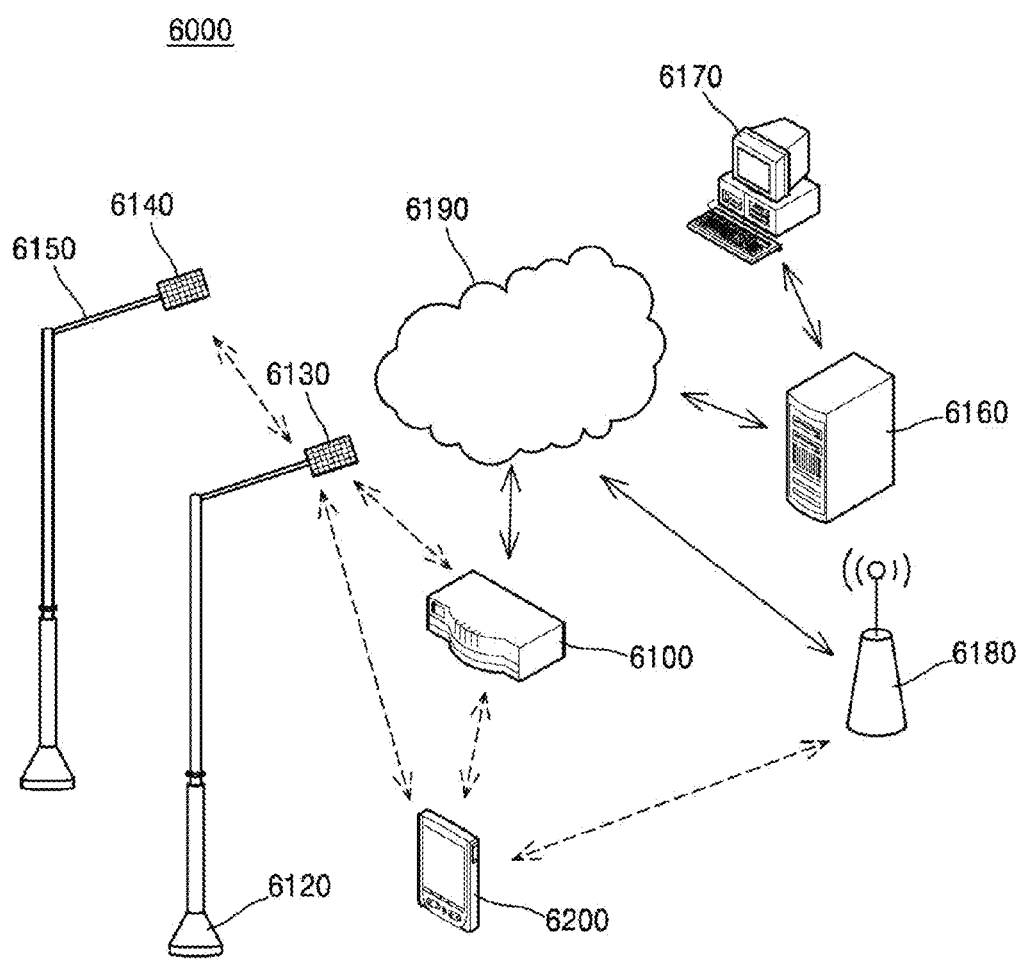
FIG. 30 is a schematic diagram of a network system including an LED package, according to an exemplary embodiment.

FIG. 30 is a diagram for describing a network system 6000 according to an exemplary embodiment.

FIG. 30 illustrates the network system 6000 applied to an open space. The network system 6000 may include a communication connecting device 6100, a plurality of lighting apparatuses 6120 and 6150 installed at predetermined intervals and communicably connected to the communication connecting device 6100, a server 6160, a computer 6170 configured to manage the server 6160, a communication base station 6180, a communication network 6190 configured to connect communicable devices, and a mobile device 6200.

The plurality of lighting apparatuses 6120 and 6150 installed in open external spaces such as streets or parts may include smart engines 6130 and 6140, respectively. Each of the smart engines 6130 and 6140 may include an LED configured to emit light, a driver configured to drive the LED, a sensor configured to collect information about an ambient environment, and a communication module. The LEDs included in the smart engine 6130 and 6140 may be the LED package 200 according to the above-described exemplary embodiments.

The communication module may enable the smart engines 6130 and 6140 to communicate with other peripheral devices in accordance with the communication protocol such as WiFi, ZigBee, or LiFi.

For example, one smart engine 6130 may be communicably connected to the other smart engine 6140. In the exemplary embodiment, a WiFi mesh may be applied to the communication between the smart engines 6130 and 6140. At least one smart engine 6130 may be connected to the communication connecting device 6100 connected to the communication network 6190 by a wired/wireless communication. In order to increase the efficiency of communication, the plurality of smart engines 6130 and 6140 may be grouped into one group and be connected to one communication connecting device 6100.

The communication connecting device 6100 may be an access point (AP) capable of performing wired/wireless communications and may relay a communication between the communication network 6190 and other devices. The communication connecting device 6100 may be connected to the communication network 6190 by at least one of the wired/wireless communication schemes. For example, the communication connecting device 6100 may be mechanically accommodated in one of the lighting apparatuses 6120 and 6150.

The communication connecting device 6100 may be connected to the mobile device 6200 through the communication protocol such as WiFi. A user of the mobile device 6200 may receive information about the ambient environment, which is collected by the plurality of smart engines 6130 and 6140, through the communication connecting device connected to the smart engine 6130 of the adjacent lighting apparatus 6120. The information about the ambient environment may include neighboring traffic information, weather information, and the like. The mobile device 6200 may be connected to the communication network 6190 through the communication base station 6180 by a wireless cellular communication scheme such as a 3G or 4G communication scheme.

On the other hand, the server 6160 connected to the communication network 6190 may receive information collected by the smart engines 6130 and 6140 respectively mounted on the lighting apparatuses 6120 and 6150 and may monitor the operation states of the lighting apparatuses 6120 and 6150. In order to manage the lighting apparatuses 6120 and 6150 based on the monitoring result of the operation states of the lighting apparatuses 6120 and 6150, the server 6160 may be connected to the computer 6170 that provides the management system. The computer 6170 may execute software capable of monitoring and managing the operation states of the lighting apparatuses 6120 and 6150, especially the smart engines 6130 and 6140.

Figure 31:
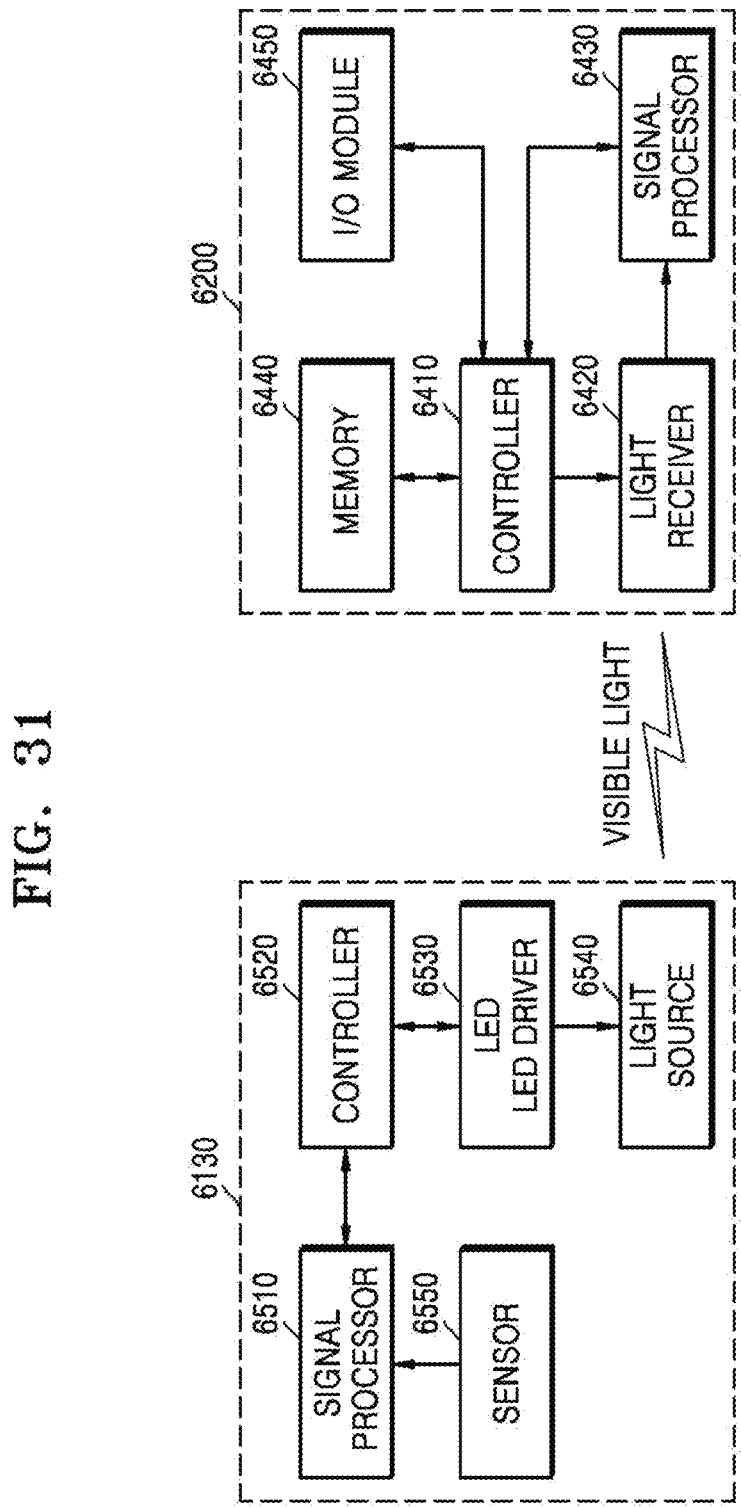
FIG. 31 is a block diagram for describing communication operations between a smart engine of a lighting apparatus including an LED package and a mobile device, according to an exemplary embodiment.

FIG. 31 is a block diagram for describing a communication operation between a smart engine 6130 of a lighting apparatus 6120 and a mobile device 6200, according to an exemplary embodiment.

FIG. 31 is a block diagram for describing a communication operation between the smart engine 6130 of the lighting apparatus 6120 of FIG. 30 and the mobile device 6200 via the visible light wireless communication. Various communication schemes may be applied for transmitting information collected by the smart engine 6130 to the mobile device 6200 of the user.

Through the communication connecting device (6100 of FIG. 30) connected to the smart engine 6130, the information collected by the smart engine 6130 may be transmitted to the mobile device 6200, or the smart engine 6130 and the mobile device 6200 may be directly communicable connected to each other. The smart engine 6130 and the mobile device 6200 may directly communicate with each other through the visible light wireless communication (LiFi).

The smart engine 6130 may include a signal processor 6510, a controller 6520, an LED driver 6530, a light source 6540, and a sensor 6550. The mobile device 6200, which is connected to the smart engine 6130 through the visible light wireless communication, may include a controller 6410, a light receiver 6420, a signal processor 6430, a memory 6440, and an input/output (I/O) module 6450.

The visible light wireless communication (LiFi) technology is a wireless communication technology that wirelessly transmits information by using light of a visible light wavelength the human may recognize with his/her eyes. The visible light wireless communication technology differs from the existing wired optical communication technology and infrared wireless communication in that the light of the visible light wavelength, that is, a specific frequency of visible light from the LED device package, is used, and differs from the wired optical communication technology in that communication environment is a wireless environment. Contrary to the RF wireless communication technology, the visible light wireless communication technology may freely be used without regulation or permission in terms of frequency use. In addition, the visible light wireless communication technology has excellent physical security and is different in that a user may confirm a communication link with his/her eyes. Furthermore, the visible light wireless communication technology is a convergence technology that is capable of simultaneously obtaining the unique purpose of the light source and the communication function.

The signal processor 6510 of the smart engine 6130 may process data to be transmitted and received through the visible light wireless communication. For example the signal processor 6510 may process information collected by the sensor 6550 into data and transmit the data to the controller 6520. The controller 6520 may control the operations of the signal processor 6510 and the LED driver 6530. In particular, the controller 6520 may control the operation of the LED driver 6530 based on the data transmitted by the signal processor 6510. The LED driver 6530 may transmit the data to the mobile device 6200 by turning on the light source 6540 according to a control signal transmitted by the controller 6520.

The mobile device 6200 may include the light receiver 6420 configured to recognize visible light including data, as well as the controller 6410, the memory 6440 configured to store data, the I/O module 6450 including a display, a touch screen, and an audio output unit, and the signal processor 6430. The light receiver 6420 may detect visible light and convert the detected visible light into an electrical signal. The signal processor 6430 may decode data included in the electrical signal. The controller 6410 may store the decoded data output from the signal processor 6430 in the memory 6440, or may output the decoded data through the I/O module 6450 so as to allow the user to recognize the decoded data.

Figure 32:
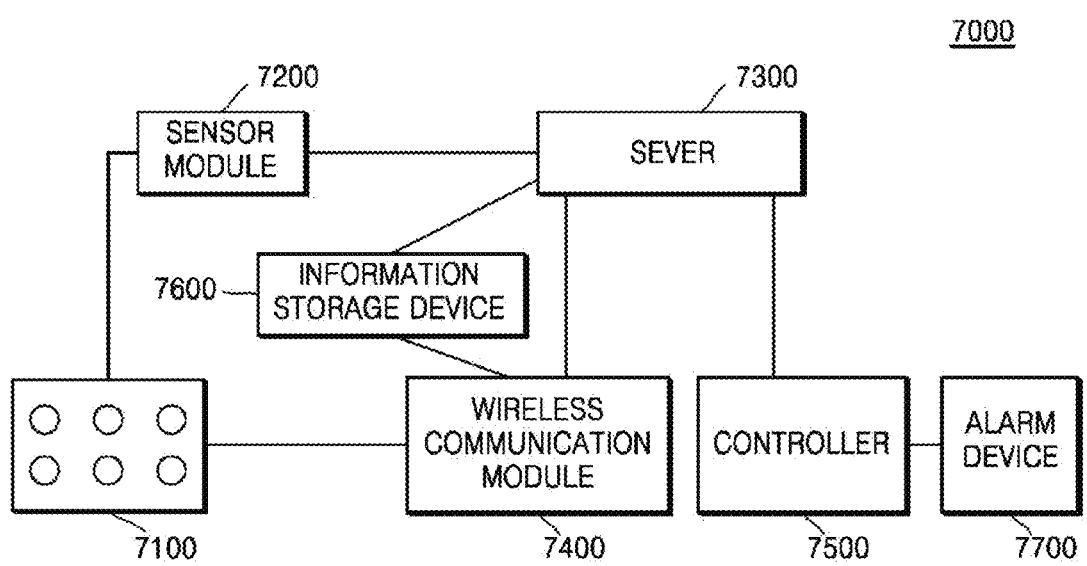
FIG. 32 is a block diagram of a smart lighting system including an LED package, according to an exemplary embodiment.

FIG. 32 is a block diagram of a smart lighting system 7000 according to an exemplary embodiment.

Referring to FIG. 32, the smart lighting system 7000 may include an illumination module 7100, a sensor module 7200, a server 7300, a wireless communication module 7400, a controller 7500, and an information storage device 7600. The illumination module 7100 may include one or more lighting apparatuses installed in a building and there is no limitation to a type of the lighting apparatus. Examples of the lighting apparatus may include basic illuminations for a living room, a room, a balcony, a bathroom, stairs, and a front door, a mood illumination, a stand illumination, and a decorative illumination. The lighting apparatus may be the LED package 200 according to the above-described exemplary embodiments.

The sensor module 7200 may detect illumination states related to the turn-on/off of each lighting apparatus and the intensity of the illumination, output a signal corresponding to the detected illumination state, and transmit the signal to the server 7300. The sensor module 7200 may be provided in the building where the lighting apparatus is installed. One or more sensors module 7200 may be at a position where the illumination states of all the lighting apparatuses controlled by the smart lighting system 7000 are detectable, or may be provided at each of the lighting apparatuses.

The information about the illumination state may be transmitted to the server 7300 in real time, or may be transmitted with a time difference based on predetermined time unit such as minute unit or hour unit. The server 7300 may be installed inside and/or outside the building. The server 7300 may receive a signal from the sensor module 7200, collect information about the illumination state, such as the turn-on/off of the lighting apparatus within the building, group the collected information, define an illumination pattern based on the grouped information, and provide information about the defined illumination pattern to the wireless communication module 7400. In addition, the server 7300 may serve as a medium that transmits a command received from the wireless communication module 7400 to the controller 7500.

Specifically, the server 7300 may receive the information about the illumination state of the building, which is detected and transmitted by the sensor module 7200, and collect and analyze the information about the illumination state. For example, the server 7300 may divide the collected information into various groups by period, such as time, day, day of week, weekdays and weekends, a preset specified day, a week, and a month. Then, the server 7300 may program a "defined illumination pattern" defined as an illumination pattern of an average day unit, week unit, weekday unit, weekend unit, and month unit based on the grouped information. The "defined illumination pattern" may be periodically provided to the wireless communication module 7400, or may be received from the server 7300 in response to a request for providing information when the user requests the information about the illumination pattern.

In addition, apart from the defining of the illumination pattern from the information about the illumination state received from the sensor module 7200, the server 7300 may provide the wireless communication module 7400 with a "normal illumination pattern" programmed in advance by reflecting a normal illumination state occurring at home. As in the case of the "defined illumination pattern", the "normal illumination pattern" may be periodically provided from the server 7300, or may be provided when there is a request from a user. Only one server 7300 is illustrated in FIG. 32, but two or more servers may be provided when necessary.

Optionally, the "normal illumination pattern" and/or the "defined illumination pattern" may be stored in the information storage device 7600. The information storage device 7600 may be a so-called cloud that is accessible via a network.

The wireless communication module 7400 may select one of the plurality of illumination patterns received from the server 7300 and/or the information storage device 7600 and transmit a command signal for executing or stopping an "automatic illumination mode" to the server 7300. The wireless communication module 7400 may be applied to various portable wireless communication devices such as smartphones, tablet PCs, PDAs, notebook computers, or netbook computers, which may be carried by the user of the smart lighting system.

Specifically, the wireless communication module 7400 may receive various defined illumination patterns from the server 7300 and/or the information storage device 7600, select necessary patterns from the received illumination patterns, and transmit a command signal to the server 7300 so as to execute the "automatic illumination mode" to operate the illumination module 7100 in the selected illumination pattern. The command signal may be transmitted at a set execution time. Alternatively, after the command signal is transmitted without defining a stop time, the execution of the "automatic illumination mode" may be stopped by transmitting a stop signal when necessary.

In addition, the wireless communication module 7400 may further have a function of allowing the user to partially modify the illumination pattern received from the server 7300 and/or the information storage device 7600 or manipulate a new illumination pattern when necessary. The modified or newly manipulated "user setting illumination pattern" may be stored in the wireless communication module 7400, may be automatically transmitted to the server 7300 and/or the information storage device 7600, or may be transmitted when necessary. In addition, the wireless communication module 7400 may automatically receive the "defined illumination pattern" and the "normal illumination pattern" from the server 7300 and/or the information storage device 7600, or may receive the "defined illumination pattern" and the "normal illumination pattern" by transmitting a provision request signal to the server 7300.

The wireless communication module 7400 may exchange a necessary command or information signal with the server 7300 and/or the information storage device 7600, and the server 7300 may serve as a medium between the wireless communication module 7400, the sensor module 7200, and the controller 7500. In this manner, the smart lighting system may be operated.

The connection between the wireless communication module 7400 and the server 7300 may be performed using an application program of the smartphone. That is, the user may instruct the server 7300 to execute the "automatic illumination mode" through an application program downloaded in the smartphone, or may provide information about the user setting illumination pattern" manipulated or modified by the user.

The information may be automatically provided to the server 7300 and/or the information storage device 7600 by the storing of the "user setting illumination pattern", or may be provided by performing a transmission operation. This may be determined as a default of the application program, or may be selected by the user according to an option.

The controller 7500 may receive the command signal of executing or stopping the "automatic illumination mode" from the server 7300, and control one or more lighting apparatuses by executing the received command signal in the illumination module 7100. That is, the controller 7500 may control the turn-on/off or the like of the lighting apparatuses included in the illumination module 7100 according to the command signal from the server 7300.

In addition, the smart lighting system 7000 may further include an alarm device 7700 in the building. The alarm device 7700 may give an alarm when there is an intruder in the building.

Specifically, in a case where the "automatic illumination mode" is executed in the building in the absence of the user, when there is occurs an intruder in the building and there occurs an abnormal situation deviating from the set illumination pattern, the sensor module 7200 may detect the abnormal situation and transmit an alarm signal to the server 7300. The server 7300 may notify the wireless communication module 7400 of the abnormal situation and operate the alarm device 7700 in the building by transmitting a signal to the controller 7500.

In addition, when the alarm signal is transmitted to the server 7300, the server 7300 may further include a system that directly notifies a security company of an emergency situation via the wireless communication module 7400 or a TCP/IP network.

While exemplary embodiments have been particularly shown and described above, it will be understood by one of ordinary skilled in the art that various changes in form and details may be made therein without departing from the spirit and scope of the inventive concept as defined by the following claims.

What is claimed is:

1. A light-emitting diode (LED) package comprising:
a substrate;
a light-emitting structure provided on the substrate;
an electrode structure provided on the light-emitting structure; and
an external connection terminal provided on the electrode structure, the external connection terminal comprising a major axis and a minor axis,
wherein the major axis of the external connection terminal is perpendicular to an m(10-10) plane of the substrate.

2. The LED package of claim 1, wherein the major axis corresponds to an extending direction of a first side of the external connection terminal which is longer than a second side of the external connection terminal, the second side extending in a direction substantially perpendicular to the first side, and
wherein the minor axis extends in a direction substantially perpendicular to the major axis.

3. The LED package of claim 1, wherein the substrate transmits light, and
wherein the light generated by the light-emitting structure is emitted in a direction toward the substrate.

4. The LED package of claim 1, wherein the substrate is a sapphire substrate.

5. The LED package of claim 1, wherein a portion of the substrate comprises a straight flat zone, and
wherein the flat zone corresponds to a (11-20) plane from among crystal planes of the substrate.

6. The LED package of claim 1, wherein the light-emitting structure comprises:
a first conductive semiconductor layer;
an active layer; and
a second conductive semiconductor layer.

7. The LED package of claim 1, wherein the light-emitting structure comprises a gallium nitride based material.

8. The LED package of claim 1, wherein the electrode structure comprises:
a first electrode structure; and
a second electrode structure, and
wherein the external connection terminal comprises:
a first external connection terminal that is electrically connected to the first electrode structure; and
a second external connection terminal that is electrically connected to the second electrode structure.

9. The LED package of claim 8, wherein the first external connection terminal comprises at least one first conductive sub-terminal, and
wherein the second external connection terminal comprises at least one second conductive sub-terminal.

10. The LED package of claim 1, wherein the substrate comprises a stress concentration area having a stress of 1 GPa or more being concentrated, and
wherein the stress concentration area is provided on a surface of the substrate that is parallel to the major axis of the external connection terminal.

11. The LED package of claim 1, wherein, in response to a crack being on the substrate, a spreading direction of the crack is perpendicular to an extending direction of the major axis of the external connection terminal.

12. An LED package comprising:
a sapphire substrate;
a light-emitting structure provided on the sapphire substrate, the light-emitting structure comprising:
a first conductive semiconductor layer;
an active layer; and
a second conductive semiconductor layer;
a first electrode structure electrically connected to the first conductive semiconductor layer;
a second electrode structure electrically connected to the second conductive semiconductor layer;
a first external connection terminal electrically connected to the first electrode structure and comprising a first major axis and a first minor axis; and
a second external connection terminal electrically connected to the second electrode structure and comprising a second major axis and a second minor axis,
wherein light generated from the light-emitting structure is emitted in a direction toward the sapphire substrate,
wherein the first and second external connection terminals are spaced apart from each other, and
wherein an extending direction of the major axes of the first and the second external connection terminals are perpendicular to an extending direction of an m(10-10) plane of the sapphire substrate.

13. The LED package of claim 12, wherein the first major axis corresponds to an extending direction of a first side of the first external connection terminal which is longer than a second side of the first external connection terminal, the second side of the first external connection terminal extending in a direction substantially perpendicular to the first side of the first external connection terminal,
wherein the first minor axis extends in a direction substantially perpendicular to the first major axis,
wherein the second major axis corresponds to an extending direction of a first side of the second external connection terminal which is longer than a second side of the second external connection terminal, the second side of the second external connection terminal extending in a direction substantially perpendicular to the first side of the second external connection terminal, and
wherein the second minor axis extends in a direction substantially perpendicular to the second major axis.

14. The LED package of claim 12, wherein a crystal plane of an upper surface of the sapphire substrate corresponds to a (0001) plane or a (000-1) plane, the light-emitting structure provided on the upper surface of the sapphire substrate.

15. The LED package of claim 12, wherein the first external connection terminal comprises at least one first conductive sub-terminal, and
wherein the second external connection terminal comprises at least one second conductive sub-terminal.

16. The LED package of claim 12, wherein the first and the second electrode structures reflect the light generated from the light-emitting structure.

17. A light-emitting diode (LED) package comprising:
a substrate;
a light-emitting structure provided on the substrate;
an electrode structure provided on the light-emitting structure; and
an external connection terminal provided on the electrode structure, the external connection terminal comprising a major axis and a minor axis,
wherein the major axis of the external connection terminal is perpendicular to a cleaving plane of the substrate.

18. The LED package of claim 17, wherein the cleaving plane of the substrate corresponds to an m(10-10) plane among crystal planes of the substrate.

19. The LED package of claim 17, wherein the major axis corresponds to an extending direction of a first side of the external connection terminal which is longer than a second side of the external connection terminal, the second side extending in a direction substantially perpendicular to the first side, and
wherein the minor axis extends in a direction substantially perpendicular to the major axis.

20. The LED package of claim 17, wherein, in response to a crack being on the substrate, a spreading direction of the crack is perpendicular to an extending direction of the major axis of the external connection terminal.

* * * * *